US012745554B2

(12) United States Patent
Quinn et al.

(10) Patent No.: US 12,745,554 B2
(45) Date of Patent: Sep. 22, 2026

(54) ORGANIC VAPOR JET PRINTING SYSTEM

(71) Applicant: Universal Display Corporation, Ewing, NJ (US)

(72) Inventors: William E. Quinn, Whitehouse Station, NJ (US); Gregory Mcgraw, Yardley, PA (US); Roman Korotkov, Cranbury, NJ (US); Craig Anthony Outten, Rydal, PA (US)

(73) Assignee: Universal Display Corporation, Ewing, NJ (US)

( * ) Notice: Subject to any disclaimer, the term of this patent is extended or adjusted under 35 U.S.C. 154(b) by 780 days.

(21) Appl. No.: 18/104,353

(22) Filed: Feb. 1, 2023

(65) Prior Publication Data

US 2023/0269994 A1 Aug. 24, 2023

Related U.S. Application Data

(60) Provisional application No. 63/312,853, filed on Feb. 23, 2022.

(51) Int. Cl.
*H10K 71/13* (2023.01)
*H10P 14/60* (2026.01)
(Continued)

(52) U.S. Cl.
CPC ......... *H10K 71/13* (2023.02); *H10P 14/6304* (2026.01); *H10P 14/6903* (2026.01); *H10P 50/00* (2026.01); *H10K 2102/00* (2023.02)

(58) Field of Classification Search
CPC ............... H10K 71/13; H10K 2102/00; H10K 59/1201; H10K 71/166; H10K 71/135;
(Continued)

(56) References Cited

U.S. PATENT DOCUMENTS

| | | | |
|---|---|---|---|
| 4,769,292 | A | 9/1988 | Tang |
| 5,247,190 | A | 9/1993 | Friend |

(Continued)

FOREIGN PATENT DOCUMENTS

| | | | | |
|---|---|---|---|---|
| EP | 3406755 | A1 * | 11/2018 | ........... H10K 71/164 |
| WO | 2008057394 | A1 | 5/2008 | |

(Continued)

OTHER PUBLICATIONS

Baldo et al. "Highly efficient phosphorescent emission from organic electroluminescent devices", Nature, vol. 395, pp. 151-154, 1998.

(Continued)

*Primary Examiner* — Mohammed Shamsuzzaman
(74) *Attorney, Agent, or Firm* — Butzel Long

(57) ABSTRACT

Implementations of the disclosed subject matter provide an organic vapor jet print die including a linear array of depositors, with each of the depositors having a cluster of apertures. The organic vapor jet print die may include at least one first aperture in each cluster of apertures is a delivery aperture that is in fluid communication with a carrier gas source and an evaporation oven. At least one second aperture in each cluster of apertures may be an exhaust aperture in fluid communication with a vacuum reservoir with a static pressure lower than that at the apertures. The delivery apertures and exhaust apertures may have a uniformity that is less than 0.4%.

15 Claims, 23 Drawing Sheets

(51) Int. Cl.
*H10P 14/69* (2026.01)
*H10P 50/00* (2026.01)
*H10K 102/00* (2023.01)

(58) Field of Classification Search
CPC ........... H01L 21/02123; H01L 21/0223; H01L 21/302; H01L 21/67; H01L 21/6715; C23C 14/042; C23C 14/12; C23C 14/24; B41J 2/03
See application file for complete search history.

(56) References Cited

U.S. PATENT DOCUMENTS

| | | | | |
|---|---|---|---|---|
| 5,703,436 | A | 12/1997 | Forrest | |
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 6,537,688 | B2 | 3/2003 | Silvernail | |
| 6,597,111 | B2 | 7/2003 | Silvernail | |
| 6,664,137 | B2 | 12/2003 | Weaver | |
| 6,835,950 | B2 | 12/2004 | Brown | |
| 6,888,305 | B2 | 5/2005 | Weaver | |
| 6,888,307 | B2 | 5/2005 | Silvernail | |
| 6,897,474 | B2 | 5/2005 | Brown | |
| 7,187,119 | B2 | 3/2007 | Weaver | |
| 7,279,704 | B2 | 10/2007 | Walters | |
| 7,431,968 | B1 | 10/2008 | Shtein | |
| 7,683,534 | B2 | 3/2010 | Weaver | |
| 7,968,146 | B2 | 6/2011 | Wagner | |
| 11,267,012 | B2 * | 3/2022 | McGraw | C23C 14/12 |
| 12,442,068 | B2 * | 10/2025 | McGraw | C23C 14/228 |
| 2003/0230980 | A1 | 12/2003 | Forrest | |
| 2004/0174116 | A1 | 9/2004 | Lu | |
| 2010/0245479 | A1 * | 9/2010 | Forrest | B41J 2/005<br>347/47 |
| 2015/0140214 | A1 * | 5/2015 | Forrest | C23C 14/04<br>427/255.6 |
| 2017/0229663 | A1 | 8/2017 | Tsai | |
| 2017/0294615 | A1 * | 10/2017 | van den Tillaart | C23C 16/545 |
| 2018/0342675 | A1 * | 11/2018 | Xu | H10K 50/11 |
| 2019/0232325 | A1 * | 8/2019 | Mcgraw | B41J 2/1626 |
| 2019/0256968 | A1 * | 8/2019 | Quinn | C23C 14/243 |
| 2019/0305224 | A1 * | 10/2019 | Hack | C23C 16/45574 |
| 2020/0235296 | A1 * | 7/2020 | Mcgraw | B41J 2/1433 |
| 2020/0303645 | A1 * | 9/2020 | Forrest | H10K 71/13 |
| 2021/0343941 | A1 * | 11/2021 | Forrest | C23C 14/12 |
| 2021/0355575 | A1 * | 11/2021 | Quinn | C23C 14/04 |
| 2023/0011198 | A1 * | 1/2023 | Quinn | C23C 14/228 |
| 2023/0103196 | A1 * | 3/2023 | Kang | H01L 24/32<br>257/774 |
| 2025/0179628 | A1 * | 6/2025 | McGraw | C23C 16/18 |

FOREIGN PATENT DOCUMENTS

| | | | | |
|---|---|---|---|---|
| WO | WO-2009011709 | A1 * | 1/2009 | B41J 2/16 |
| WO | 2010011390 | A2 | 1/2010 | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner 9.5mm width of print area
length of exhaust aperture
14um length difference (3%)

81mm width of print area
length exhaust aperture
42um length difference (8.9%)

601
601
602
603
602
603
602
603
604
605
Step 1
Step 2
Step 3

ORGANIC VAPOR JET PRINTING SYSTEM

CROSS-REFERENCE TO RELATED APPLICATIONS

This application claims priority to U.S. patent application Ser. No. 16/312,853, filed Feb. 23, 2022, the entire contents of which are incorporated herein by reference.

FIELD

The present invention relates to devices and techniques for fabricating a print die that includes buried silicon dioxide as an etch stop, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-S00 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270,0.3725]; [0.7347,0.2653]; Interior: [0.5086,0.2657] |
| Central Green | Locus: [0.0326,0.3530]; [0.3731,0.6245]; Interior: [0.2268,0.3321 |
| Central Blue | Locus: [0.1746,0.0052]; [0.0326,0.3530]; Interior: [0.2268,0.3321] |
| Central Yellow | Locus: [0.373 1,0.6245]; [0.6270,0.3725]; Interior: [0.3 700,0.4087]; [0.2886,0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an apparatus may be provided that include an organic vapor jet print die including a linear array of depositors, with each of the depositors having a cluster of apertures. The organic vapor jet print die may include at least one first aperture in each cluster of apertures is a delivery aperture that is in fluid communication with a carrier gas source and an evaporation oven. At least one second aperture in each cluster of apertures may be an exhaust aperture in fluid communication with a vacuum reservoir with a static pressure lower than that at the apertures. The delivery apertures and exhaust apertures may have a length nonuniformity that is less than 0.4%.

The delivery apertures and exhaust apertures may be formed from bonded silicon wafers and a bisection of channels etched into the face of a silicon wafer including a buried oxide layer. The channels that form the delivery apertures and/or exhaust apertures may extend completely through one of a silicon layer of a wafer with a buried oxide layer and may not extend into the silicon layer on the other side of the buried oxide layer of that wafer.

The etched delivery aperture may stop at a surface of the buried oxide layer.

The buried oxide layer may be configured to form one side of a delivery aperture and/or an exhaust aperture.

A buried oxide layer may be disposed within a middle wafer of a three-wafer stack.

A buried oxide layers may be disposed within each wafer of a two-wafer stack. The buried oxide layers may be patterned. Etched cavities positioned adjacent to the buried oxide layer may be disposed on sides of each wafer that are bonded together of the two-wafer stack.

The bonded silicon wafers may include a first silicon wafer a second silicon wafer, and a third silicon wafer. The apparatus may include delivery channels that are coupled to the delivery apertures, and exhaust channels that are coupled to the exhaust apertures, where the delivery channels and the exhaust channels terminate at the buried oxidized layer of the first silicon wafer. The second silicon wafer and the third silicon wafer may have channels that match the exhaust channels of the first silicon wafer.

The exhaust apertures may be longer than the delivery apertures.

The buried oxide layers of the bonded silicon wafers may be patterned.

The apparatus may include delivery channels that are coupled to the delivery apertures, and delivery channel extensions that are parallel to a first axis and are coupled to the delivery channels, where the delivery channels are disposed a direction that is parallel to a second axis.

The apparatus may include exhaust channels that are coupled to the exhaust apertures. Exhaust extensions for the exhaust channels may be parallel to a first axis, where the exhaust channels are parallel to a second axis.

The apparatus may include delivery channels having a first portion and a second portion that are coupled to the delivery apertures, where the first portion and the second portion bifurcate the delivery channels.

The apparatus may include delivery channels coupled to the delivery apertures, and exhaust channels coupled to the exhaust apertures. A length of the exhaust channel may be defined by an etch stop of the buried oxide layer, and a length delivery channels are based on a timed etch.

The apparatus may include a first surface of a first silicon wafer of a first wafer pair of the bonded silicon wafers, where the first surface has open exhaust channels coupled to the exhaust apertures in the first wafer pair. A second wafer may be bonded to the first wafer pair to form a print die with the bonded silicon wafers, where the second wafer pair is the same the first wafer pair.

According to an embodiment, a method may be provided that includes forming a first buried oxide layer on a first silicon wafer and a second buried oxide layer on a second silicon wafer, where the first buried oxide layer and the second buried oxide layer form etch stops. Delivery channels and exhaust channels may be formed for a print die on the first silicon wafer and the second silicon wafer, where a depth of the delivery channels and/or the exhaust channels is based on the etch stops. The first silicon wafer may be bonded to a second silicon wafer to form a wafer pair for the print die.

The method may form delivery channels having a first depth, and the exhaust channels having a second depth, where the second depth is greater than the first depth.

The method may form exhaust channels that stop at the etch stop, and the length of the delivery channels may be based on a timed etch.

The method may include grinding and polishing the first silicon wafer and the second silicon wafer to place the etch stops of the buried oxide layer at predetermined locations.

According to an embodiment, a method may be provided that includes forming a first patterned buried oxide layer on a first silicon wafer and a second patterned buried oxide layer on a second silicon wafer, where the first buried oxide layer and the second buried oxide layer form patterned etch stops, and where the first patterned buried oxide layer includes first vias and the second patterned buried oxide layer includes second vias. The method may include forming delivery channels and exhaust channels for a print die on the first silicon wafer and the second silicon wafer based on the patterned etch stops, where the exhaust channels are formed at the first vias and the second vias in the first silicon wafer and the second silicon wafer. The method may include bonding the first silicon wafer to a second silicon wafer to form a wafer pair for the print die.

A first length of the exhaust channels may increase after bonding the first silicon wafer to the second silicon wafer.

The forming the exhaust channels by the method may include performing a timed etch to form the exhaust channels through the first vias and the second vias in the first silicon wafer and the second silicon wafer.

The forming the delivery channels may include stopping the etching of each of the delivery channels based on the patterned etch stops.

The method may include grinding and polishing the first silicon wafer and the second silicon wafer to place the patterned etch stops of the buried oxide layer at predetermined locations.

The method may include forming delivery channel extensions that are parallel to a first axis, where the delivery channels for the first silicon wafer and the second silicon wafer are etched in a direction that is parallel to a second axis.

The method may include forming exhaust extensions for the exhaust channels that are parallel to a first axis, where the exhaust channels are parallel to a second axis. Forming the delivery channels may include forming a first portion and a second portion of the delivery channels to bifurcate the delivery channels.

According to an embodiment, a method may be provided that includes patterning a first silicon wafer with the exhaust channel masks, and etching the first silicon wafer to correspond to a difference between deposition channel and exhaust channel lengths. An oxidation layer may be formed on a second silicon wafer. The first silicon wafer may be bonded to the second silicon wafer to form a first wafer pair. The first wafer pair may be ground and polished to place an etch stop of the oxidation layer at a predetermined location. A first surface of the first silicon wafer of the first wafer pair may be patterned, and the first surface may be etched, where the etching of delivery channels and exhaust channels stop at the etch stop. The method may include removing the oxide layer to open the exhaust channels in the first wafer pair. A second wafer pair may be bonded to the first wafer pair to form a print die, where the second wafer pair is the same the first wafer pair.

The second wafer pair may be formed by patterning a third silicon wafer with the exhaust channel masks and etching the third silicon wafer to correspond to a difference between deposition channel and exhaust channel lengths. An oxidation layer may be formed on a fourth silicon wafer. The third silicon wafer may be bonded to the fourth silicon wafer to form the second wafer pair. The method may include grinding and polishing the second wafer pair to place an etch stop of the oxidation layer at a predetermined location. A first surface of the third silicon wafer of the second wafer pair may be patterned, and the first surface etched, where the etching of delivery channels and exhaust channels stop at the etch stop. The oxide layer may be removed to open the exhaust channels in the second wafer pair.

According to an embodiment, a method may be provided that includes forming a buried oxidized layer on a first silicon wafer. The position of the buried oxide layer may be adjusted by grinding and polishing one or more surfaces of the first silicon wafer. First delivery channels and first exhaust channels may be etched in a first surface of the first silicon wafer that stop on the buried oxidized layer. Shallow exhaust channels may be etched in a second silicon wafer that match the first exhaust channels in the first silicon wafer. The method may include bonding a first surface of the first silicon wafer to the second silicon wafer. Second delivery channels and second exhaust channels may be etched in a second surface of the first silicon wafer. Delivery channels and exhaust channels that terminate at the buried oxidized layer may be formed. The method may include etching a third silicon wafer with channels that match the first exhaust channels of the first silicon wafer. The first silicon wafer and the third silicon wafer may be bonded to form a print die.

The method may include bonding the second silicon wafer to a first side of the first silicon wafer and bonding the third silicon wafer to a second side of the first silicon wafer.

The second silicon wafer and the third silicon wafer may be thinner than the first silicon wafer.

The method may include grinding and polishing the first silicon wafer to place patterned etch stops of the buried oxide layer at predetermined locations.

According to an embodiment, a method may be provided for forming a print die that includes etching first exhaust channel extensions in a first axis in a first wafer pair including a first buried oxidized layer as a first etch stop, where the lengths of the first exhaust channel extensions are varied, where the first wafer pair includes a first silicon wafer and a second silicon wafer. First exhaust channels and first delivery channels may be etched along a second axis of the first wafer pair, where a depth of the channels is defined by the first etch stop. Second exhaust channel extensions may be etched in the first axis in a second wafer pair including a buried oxidized layer as a second etch stop, where the lengths of the second exhaust channel extensions are varied, and where the second wafer pair includes a third silicon wafer and a fourth silicon wafer. The method may include etching second exhaust channels and second delivery channels along the second axis of the second wafer pair, where a depth of the channels is defined by the second etch stop. The first wafer pair may be bonded to the second wafer pair to form a print die.

The method may include aligning the first exhaust channel extensions at a first predetermined distance from the first delivery channels and aligning the second exhaust channel extensions at a second predetermined distance the second delivery channels. The first exhaust channel extensions may form a first rectangular pattern around the first delivery channels. The second exhaust channel extensions may form a second rectangular pattern around the second delivery channels.

The first exhaust channel extensions may be arranged in a first t-shaped pattern, and the second exhaust channel extensions may be arranged in a second t-shaped pattern.

The etching the first delivery channels and the second delivery channels may include etching a first portion and a second portion of the first delivery channels and etching a third portion and a fourth portion of the second delivery channels. The first delivery channels and the second delivery channels may be bifurcated. The method may include grinding and polishing the first wafer pair and the second wafer pair to place the first etch stop and the second etch stop of the buried oxide layers at predetermined locations.

According to an embodiment, a method may be provided for forming a print die, including etching a portion of exhaust channels in a first wafer and second wafer. Exhaust and deposition channels may be etched in a third wafer that includes an etch stop layer positioned between a first surface and a second surface of the third wafer. The etched surface of the third wafer may be bonded to the first wafer so that the exhaust channels align. A second set of deposition and exhaust channels may be etched in the second surface of the third wafer, and the second surface may be bonded to the etched surface of the second wafer to form a print die.

BRIEF DESCRIPTION OF THE DRAWINGS

FIG. 5A shows the die edge with apertures, FIG. 5B shows a higher magnification view of the aperture face, and FIG. 5C shows the delivery and exhaust apertures as viewed from the substrate according to embodiments of the disclosed subject matter.

FIGS. 10A-10C show a schematic of a method of manufacturing a high uniformity print die using a patterned etch stop according to embodiments of the disclosed subject matter.

FIGS. 12A-12C show an alternate method to manufacture a high uniformity print die using a 3 wafer stack with the center wafer using a buried oxide layer as an etch stop according to embodiments of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
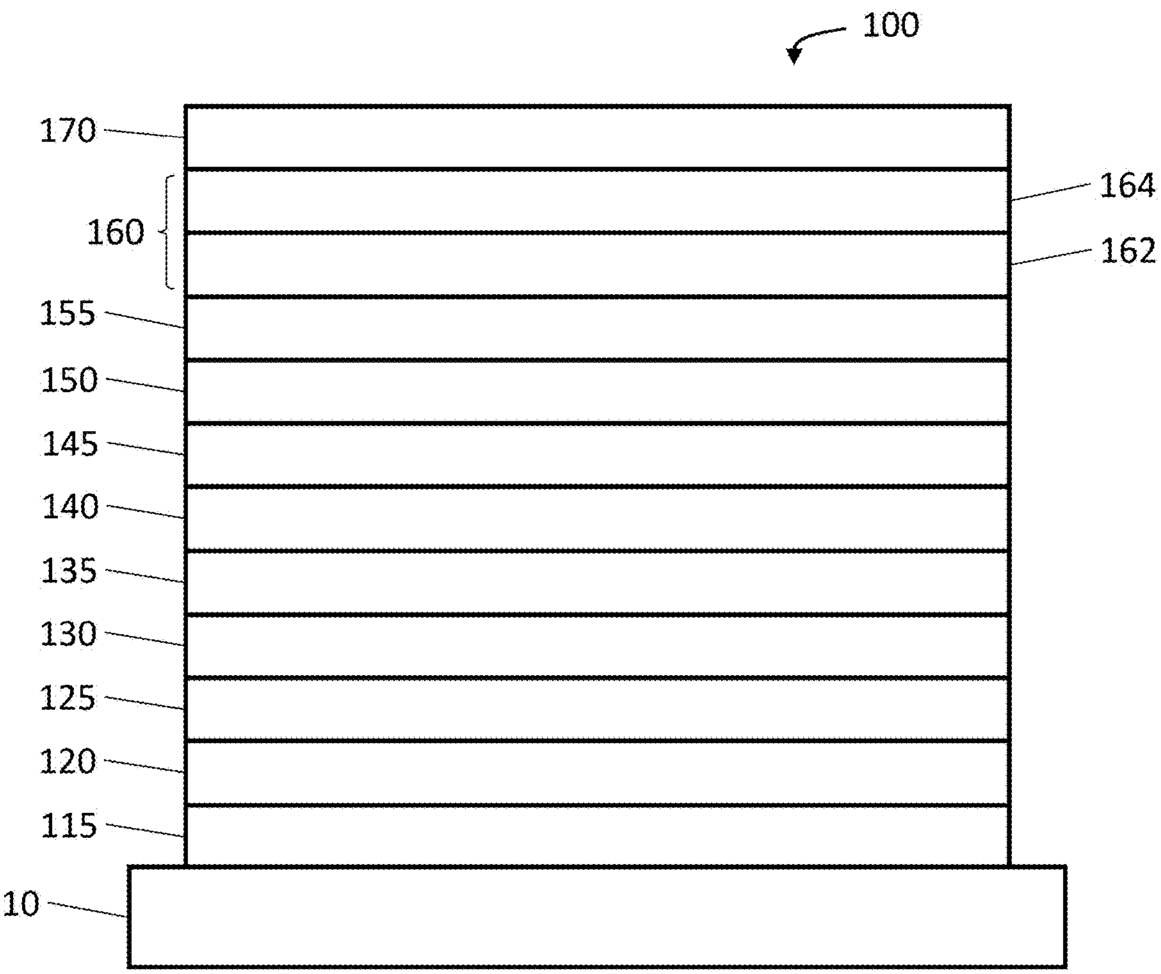
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
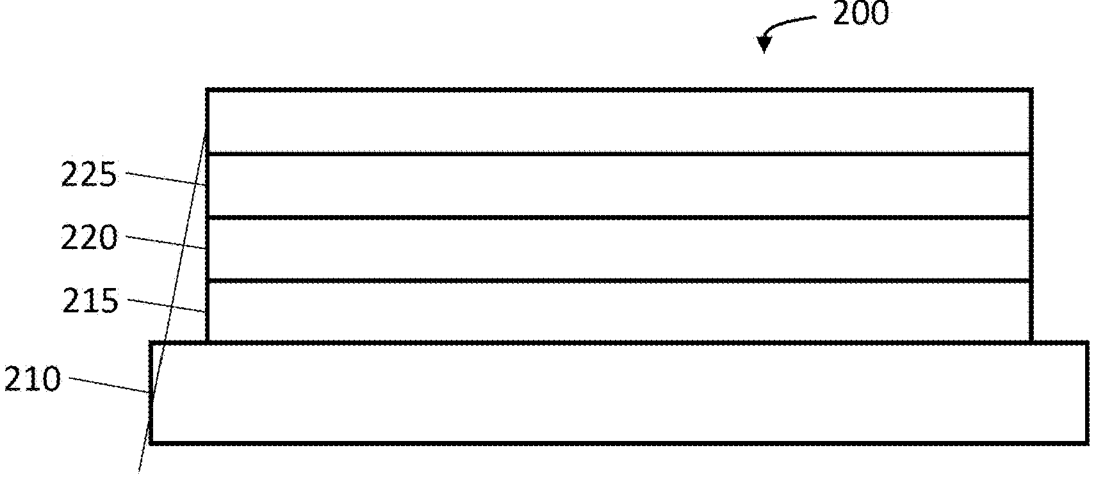
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution-based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e., P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Organic Vapor Jet Printing (OVJP) is a technique used to print fine lines of organic material on a display backplane without the use of fine metal shadow masks or liquid solvents. The method currently employed to produce mobile and laptop OLED displays uses evaporation sources and fine metal masks to pattern the deposition. Fine metal masks are typically not suitable for use in manufacturing large area displays like televisions because the masks cannot be stretched with sufficient force to prevent sagging. Ink jet printing is a potential patterning technique for OLED displays. The use of solvents to make the inks degrades the performance of the light emitting devices. OVJP eliminates these two issues by printing lines of a subpixel width without the use of fine metal masks, and deposits OLED materials without first dissolving them in solvent.

Figures 3A, 3B:
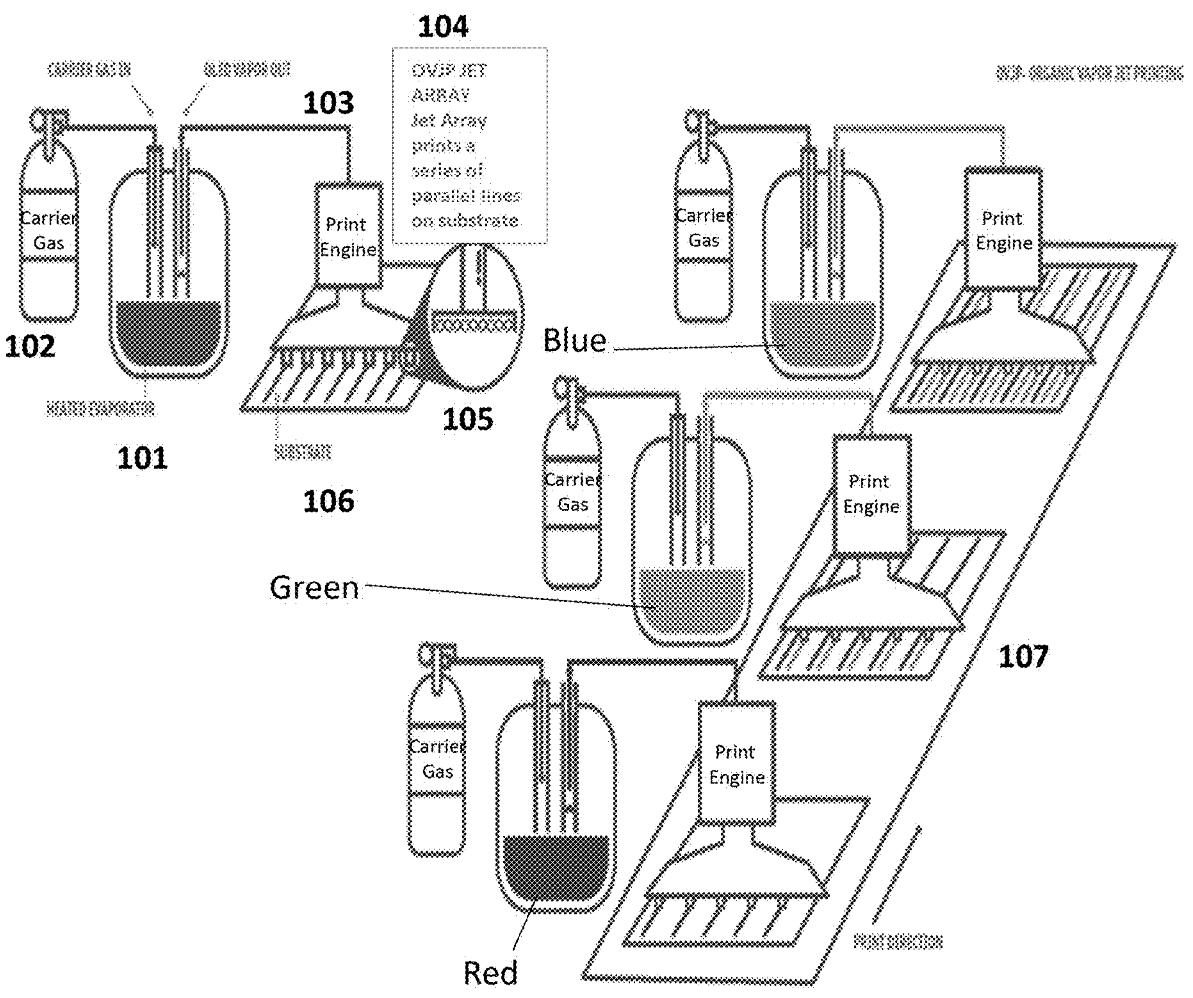
FIG. 3A shows a schematic representation of elements of an OVJP printing system (Organic Vapor Jet Printing).
FIG. 3B shows a schematic diagram showing 3 color printing in a single vacuum chamber.
Figure 3C:
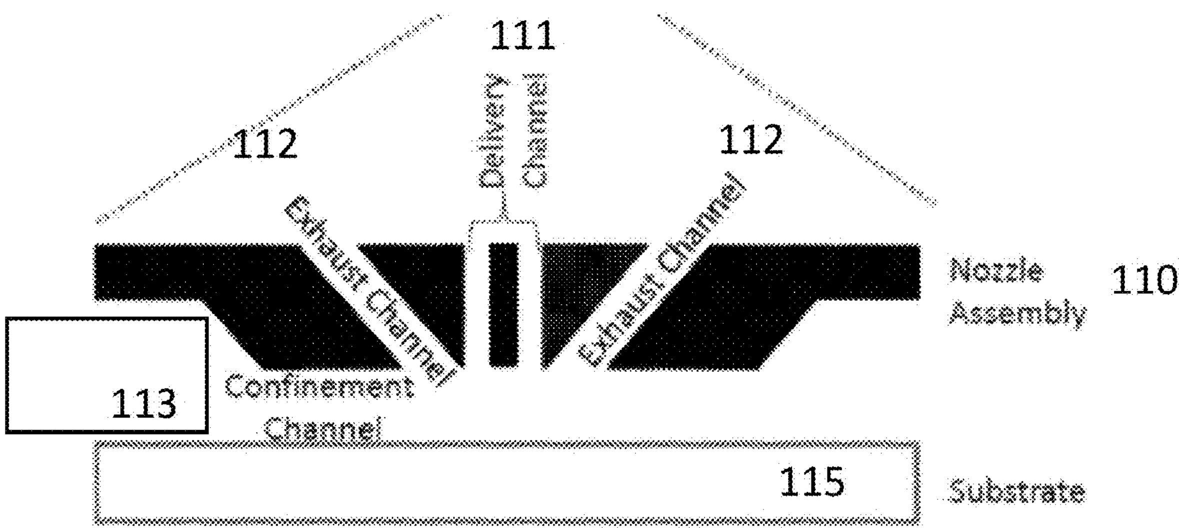
FIG. 3C shows a schematic for DEC (Deposition-Exhaust-Confinement) apertures used for OVJP printing.

In OVJP, OLED materials are heated in an enclosed container to an elevated sublimation temperature and transported to a print head through heated gas lines using an inert carrier gas. The print head may include a die with depositors. The depositors have a spacing that corresponds to the pixel spacing of the display. Apertures are formed in silicon wafers using standard MEMS (micro-electromechanical system) fabrication techniques. Print dies are cut from the wafer, with an array of delivery apertures along one edge of the die. Excess organic vapor is removed from the printing area before it can condense on the substrate by exhaust apertures adjacent to the delivery apertures on the print die. The aperture face of the die may be held above a moving display backplane and lines corresponding to the pixels are printed on the backplane. FIGS. 3A-3C show a schematic diagram of an OVJP printing system.

To achieve good uniformity in brightness and color in an OLED display, the thickness of the OLED layers must be accurately controlled, typically to within +/−2%. Deposit thickness for an OVJP deposited display is determined by the evaporation source temperature, carrier gas flow, print die to substrate distance and the size of the apertures formed in the edge of the die. Although silicon MEMS processing is a mature technology with good uniformity and repeatability for most applications, the etch uniformity is not sufficient to provide the required deposition thickness uniformity for OVJP print die. Embodiments of the disclosed subject matter provide an OVJP print die design that uses buried silicon dioxide as an etch stop layer for the deposition aperture etch. Embodiments of the disclosed subject matter provide excellent within-die, die-to-die, and wafer-to-wafer aperture uniformity.

In OVJP, OLED materials are heated in an enclosed container to sublimation temperature and transported to a print head through heated gas lines using an inert carrier gas. The print head contains a print die with a linear array of depositors with a spacing that corresponds to the pixel spacing of the display on its edge. Each depositor contains one or more delivery apertures that jets organic vapor onto the substrate and associated exhaust apertures. Apertures are formed in silicon wafers using standard MEMS fabrication techniques and print dies are cut from the wafer, with the apertures along one face of the die. Excess organic vapor may be removed from the printing area before it may condense on the substrate. Exhaust apertures adjacent to the delivery apertures on the print die may remove the excess organic vapor. The aperture face of the die is held above a moving display backplane and lines corresponding to the pixels are printed on the backplane. In some embodiments, the exhaust apertures may have different widths. For example, the exhaust apertures may have asymmetric exhaust widths. FIG. 3A shows the main components of a general OVJP printing system. Organic material is heated in a closed container 101, transported using an inert carrier gas 102 through heated gas lines 103 to the depositor array 104 that includes the apertures 105. The apertures are spaced 20 μm to 60 μm from the surface of the substrate 106.

FIG. 3B is a schematic diagram of an OVJP deposition system configured to print 3 colors (e.g., red, green, and blue) in one deposition chamber. This OVJP deposition system prints lines of OLED material spaced one (1) pixel width apart. Multicolor pixels are formed by interlacing printed lines of different colored emissive materials. Each line typically covers the active area of a subpixel and does not extend onto neighboring subpixels of different colors. Individual pixels are formed by surrounding each anode on the substrate with an insulating pixel defining layer, typically a photo-definable polyimide material. Substrates are passed through a series of print heads, with each depositing a different colored emissive material by a conveyer 107 that moves them relative to the print heads.

Figure 3D:
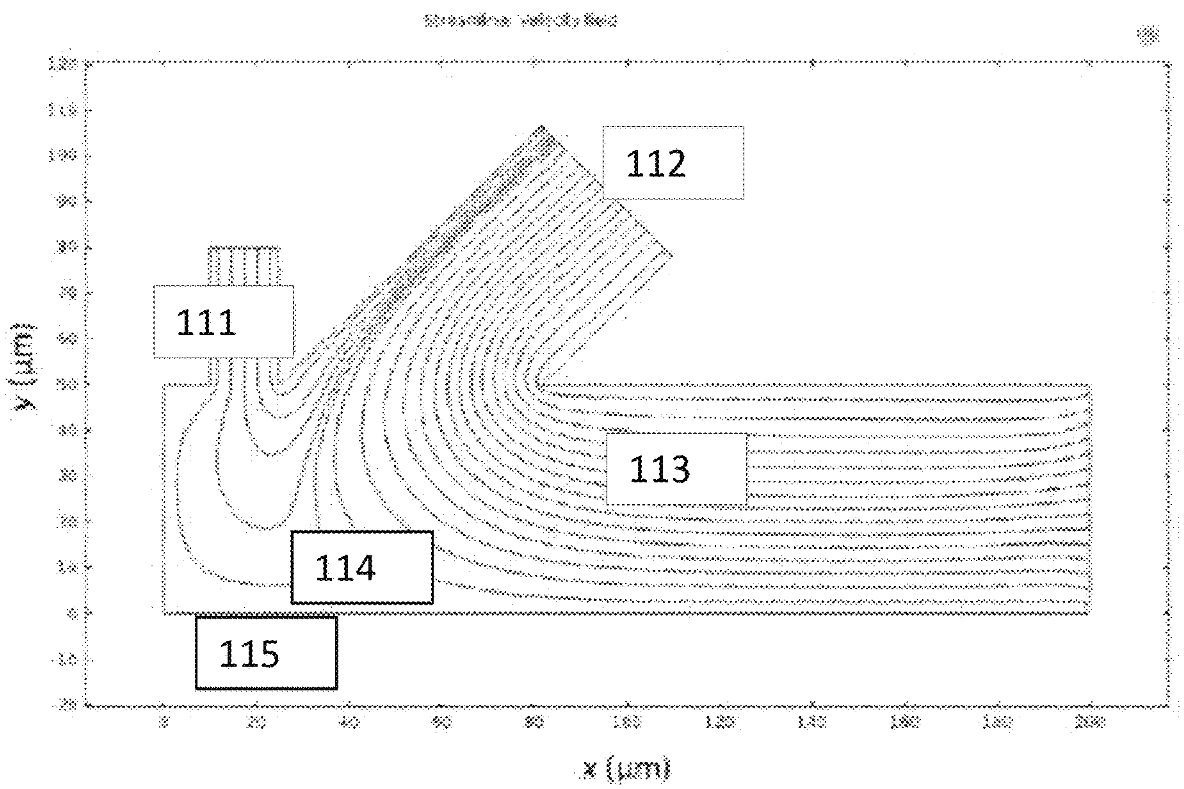
FIG. 3D shows the streamlines for a DEC aperture group.

The print head 104 consists of a heated gas manifold 103 and a silicon die manufactured using MEMS technology that attaches to the manifold. Depositors are formed in the print die within the print head and control the shape and size of the OVJP deposited lines as well as any deviations in the shape or thickness of the printed lines from the desired shape and thickness. As described in U.S. Pat. Publn. No. 2015/0376787A1, incorporated by reference herein, the depositors form the deposited line shape by controlling the long-range overspray using 3 distinct gas flows as shown in FIGS. 3C-3D. FIG. 3C shows the arrangement of a delivery channel 111, exhaust channel 112, and a confinement channel 113 formed between the MEMS die 110 and the substrate 115. Streamlines from CFD modeling of a DEC aperture assembly are shown in FIG. 3D. Carrier gas laden with organic material flows through delivery channel 111 and impinges on substrate 115. Any organic material that is not deposited on the substrate is removed by the exhaust channel 112. Confinement flow 113 limits the deposition to a stagnation plane 114, where the flow velocity in the horizontal direction is zero and the deposition and confinement flows meet and turn vertically to exit through the exhaust channel.

Figure 3E:
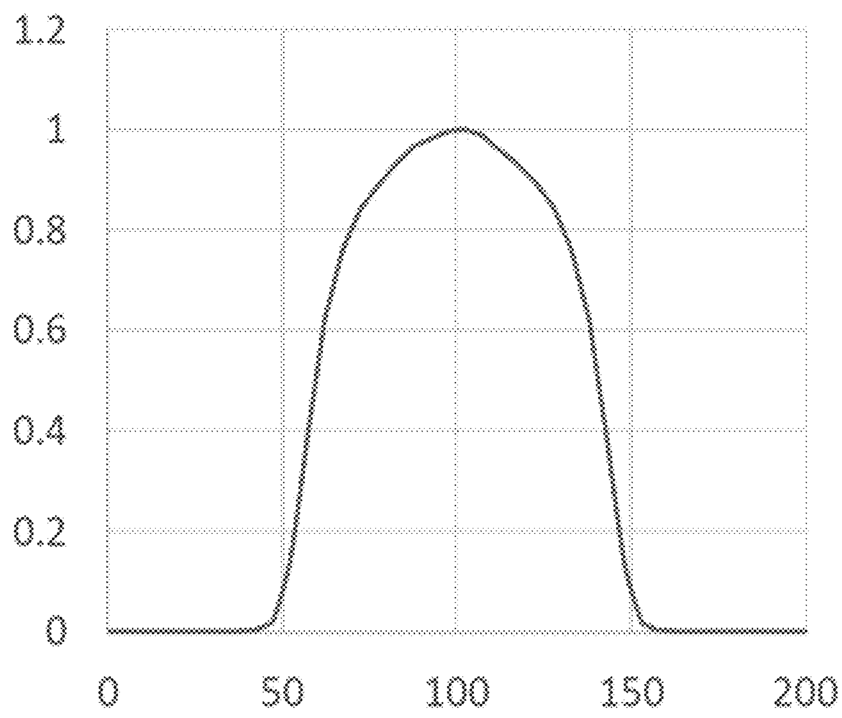
FIGS. 3E, 3F, and 3G show deposition profiles from different print die designs showing how the shape of the deposit is influenced by the delivery and exhaust aperture configuration.
Figure 3F:
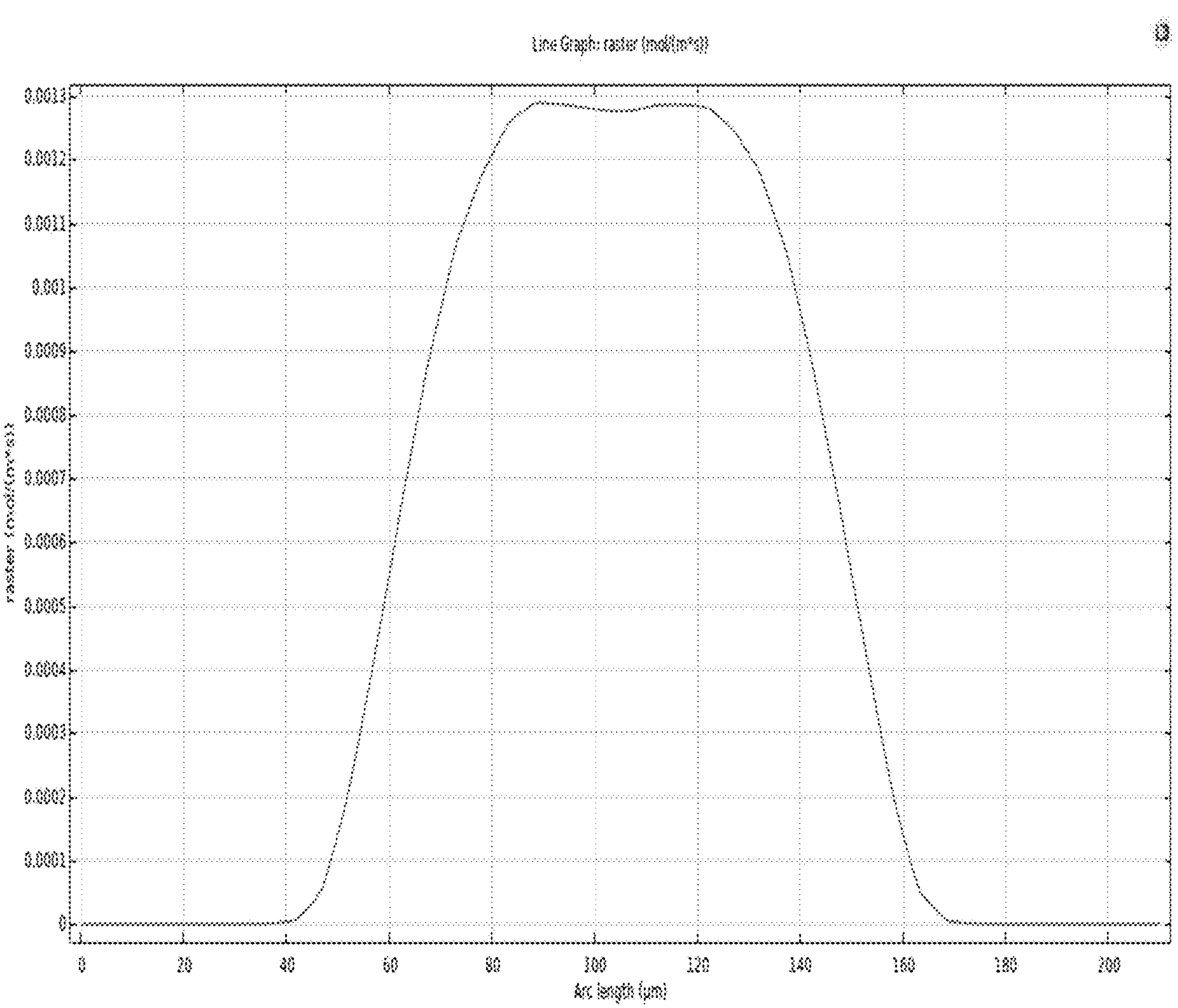
Figure 3G:
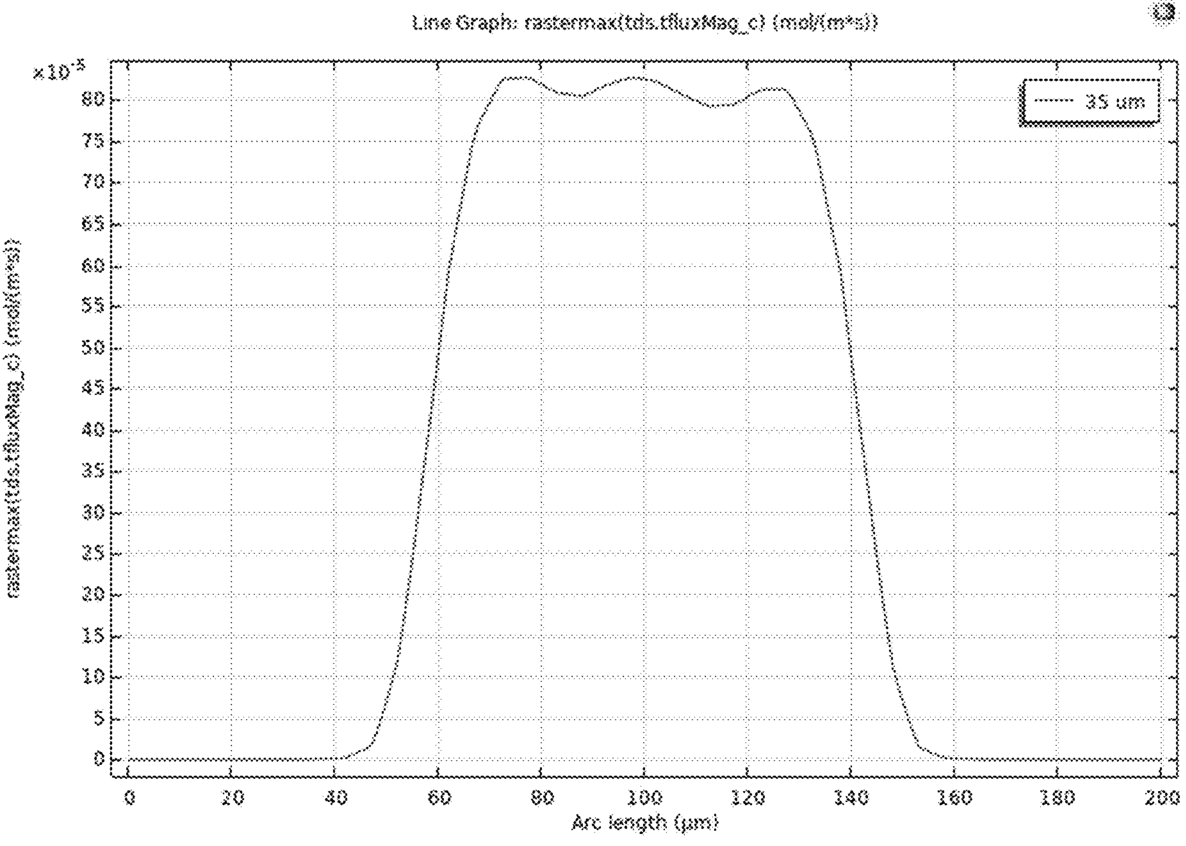

For optimum display performance and lifetime, the thickness of the OLED material deposition in each subpixel may be accurately controlled for thickness across the active area of each subpixel and from pixel to pixel in the display. FIGS. 3E, 3F, and 3G show deposition profiles for a MEMS die with different arrangements of deposition and exhaust apertures. Ideally, the profile is a square wave profile with vertical sidewalls and a flat top. In embodiments where the exhaust apertures have asymmetric exhaust widths, the vertical sidewalls may have a steeper profile than those produced with symmetric exhaust widths. The square wave profile may provide perfect within-pixel uniformity and requires minimal separation between subpixels of different colors. FIG. 3E shows a deposition profile from an early aperture design that produces a Gaussian-like profile that is not ideal for uniform pixel filling. FIG. 3F shows a more recent design that includes a flat top profile that results in good within-subpixel uniformity. FIG. 3G shows a deposition profile from a current design that shows a wide flat profile and steep vertical sidewall profiles, approximating the ideal square wave profile. As discussed above, steeper sidewalls may be achieved with asymmetric exhaust widths.

Each print die contains many depositors, that is sets of delivery and exhaust apertures that function as a unit to produce a desired deposition profile. As an example, a 100 mm wide MEMS die can contain over 250 depositors and will print one line for each depositor. Deposition rate and deposition thickness for each depositor is determined in part by the size of the apertures. Deviations in aperture size, particularly for the delivery apertures, will result in deviations in printed line thickness and an OVJP printed display will exhibit line mura. Line mura is a type of display defect that exhibits as lines in the display of different brightness or color that are readily visible to the human eye. To minimize thickness variation, aperture sizes within a die and from die-to-die may be controlled to within 1% of the desired value.

Figure 4A:
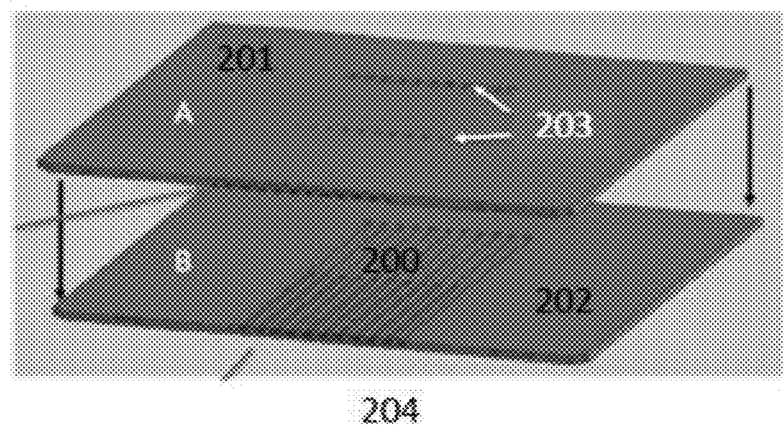
FIG. 4A shows how two wafers are bonded to make and OVJP print die according to an embodiment of the disclosed subject matter.
Figure 4B:
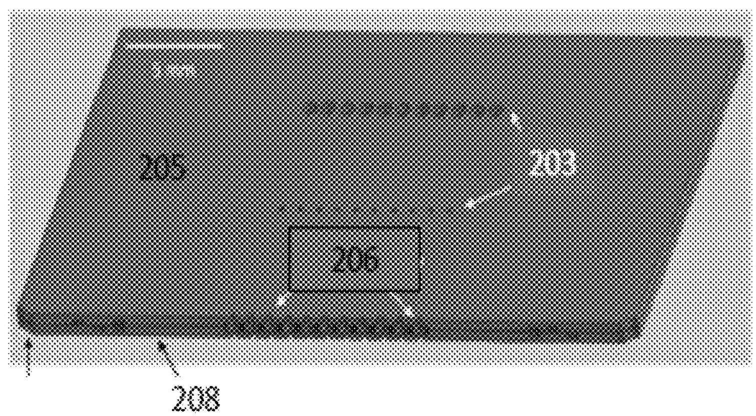
FIG. 4B shows a print die made from a bonded pair of wafers according to an embodiment of the disclosed subject matter.
Figure 4C:
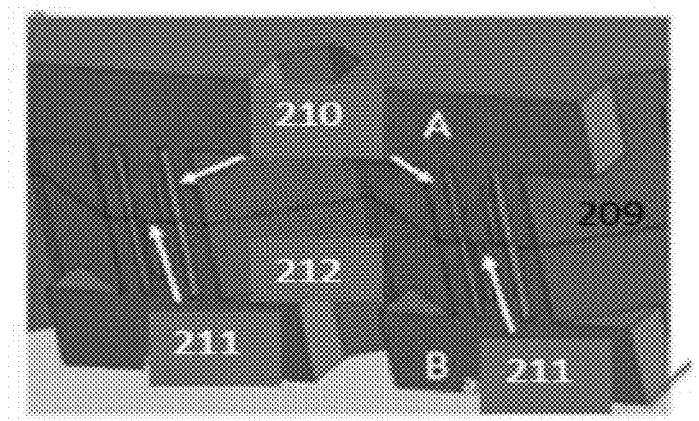
FIG. 4C shows details of the apertures formed along one edge of the die according to an embodiment of the disclosed subject matter.

FIGS. 4A-4C show print dies manufactured by etching channels into a pair of silicon wafers, bonding the wafers together, and cutting die from the bonded wafers to expose the ends of the etched channels according to embodiments of the disclosed subject matter. FIGS. 4A-4C show the process using silicon die for clarity, but the actual fabrication process take place on whole silicon wafers and the die are subsequently cut from the bonded wafer pairs. Channels 200 may be etched into the surfaces of two silicon wafers 201, 202, through wafer vias 203 to connect the delivery and exhaust channels to the "A" face of the top wafer as shown in FIG. 4A. A completed die 205 is shown in FIG. 4B. The edge of the die may include the delivery and exhaust apertures 206 and alignment features 208. FIG. 4C is an enlarged view of a depositor on the completed die showing the exhaust channels 210, delivery channels 211 confinement gas recess in the face of the die 209 and the bond line where the die is bonded together 212.

Figure 5A:
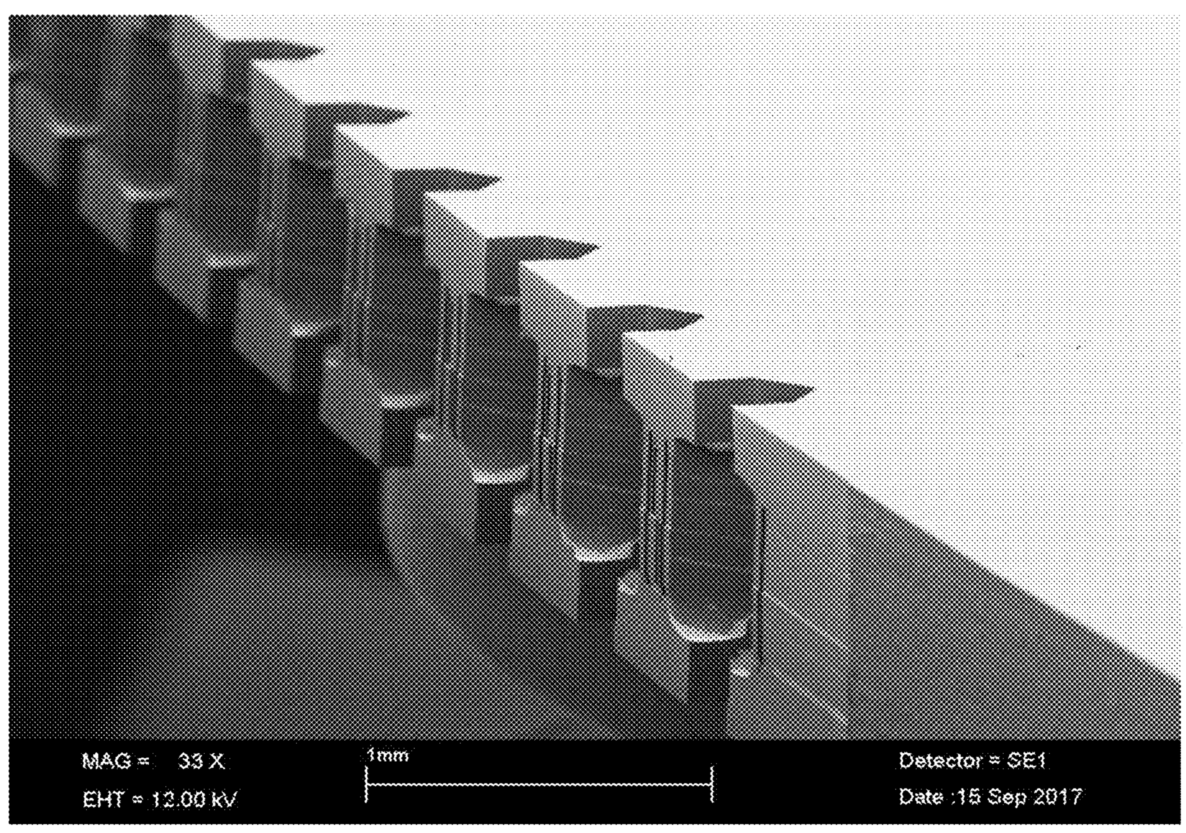
FIGS. 5A-5C show an electron micrograph of a fabricated print die, where
Figure 5B:
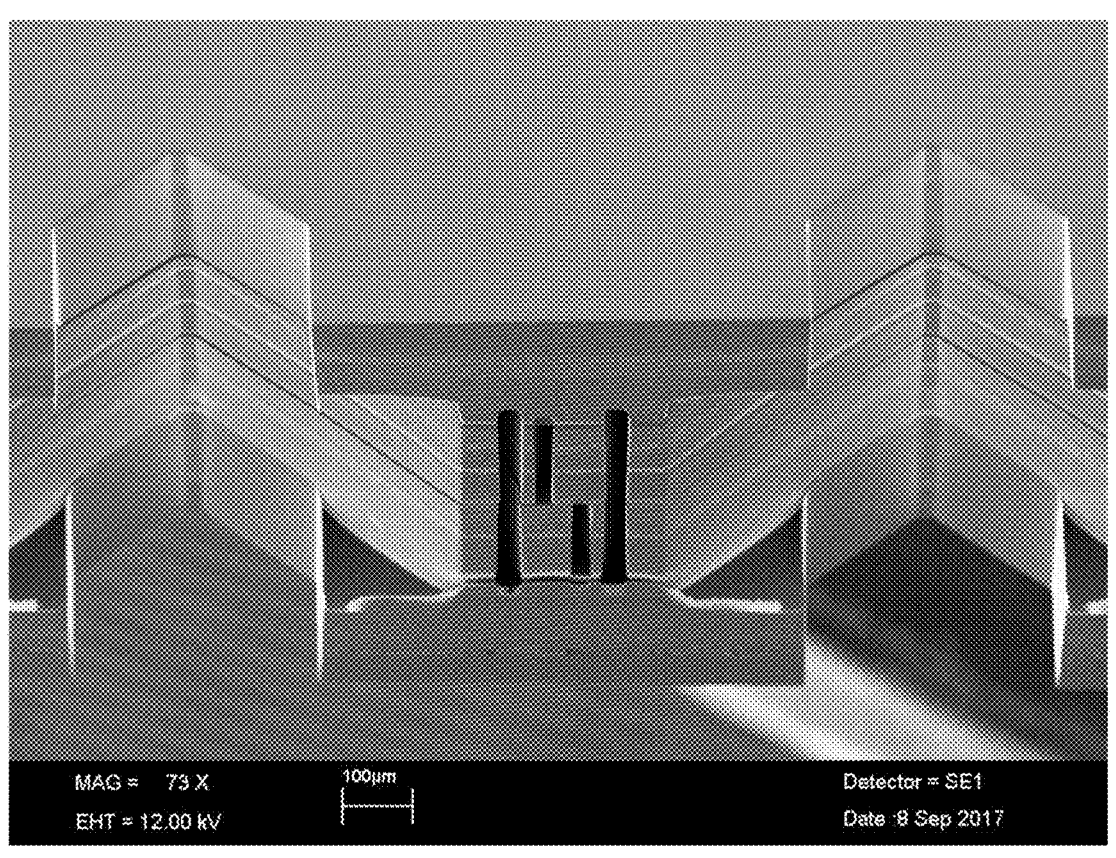
Figure 5C:
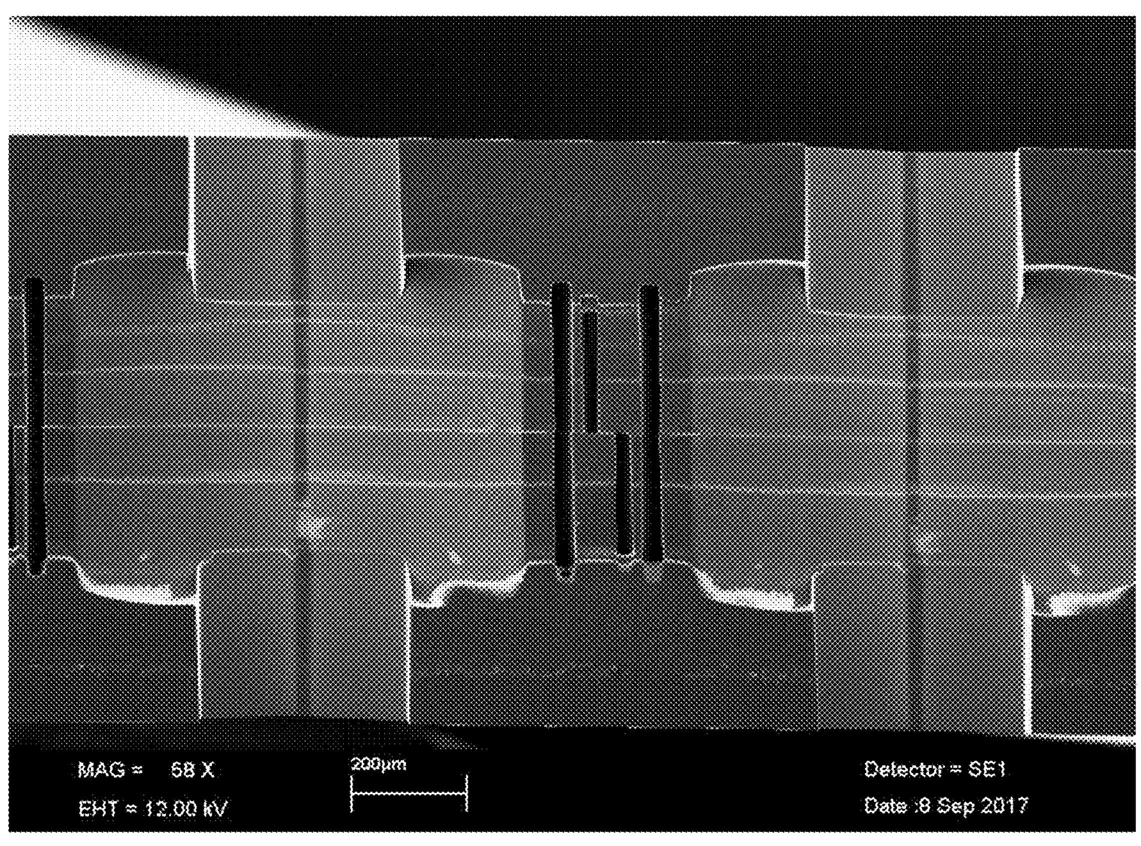

FIG. 5A shows an electron micrograph of a MEMS die showing a plurality of depositors fabricated in an OVJP die. Each depositor may print one line on a display substrate. FIG. 5B shows a magnified view of one depositor as described above in connection with FIG. 3C. A view of the die looking from the substrate is shown in FIG. 5C. As mentioned above, to obtain desired deposition thickness uniformity the size of delivery and exhaust apertures must be accurately controlled.

Figure 6A:
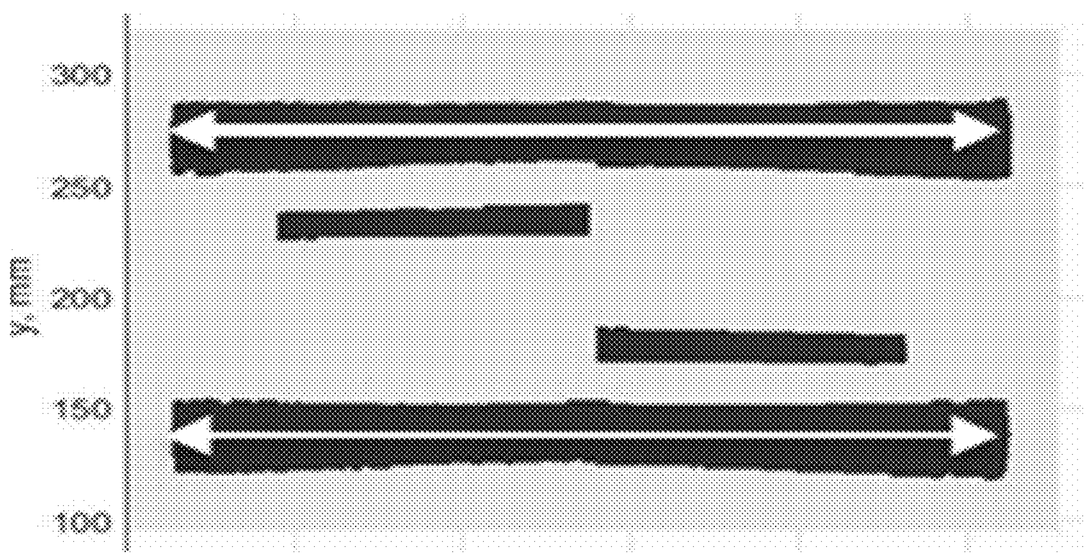
FIGS. 6A-6D show dimensions of the apertures formed in the die and aperture length measurements of deposition and exhaust apertures in a 10 depositor die.
Figure 6B:
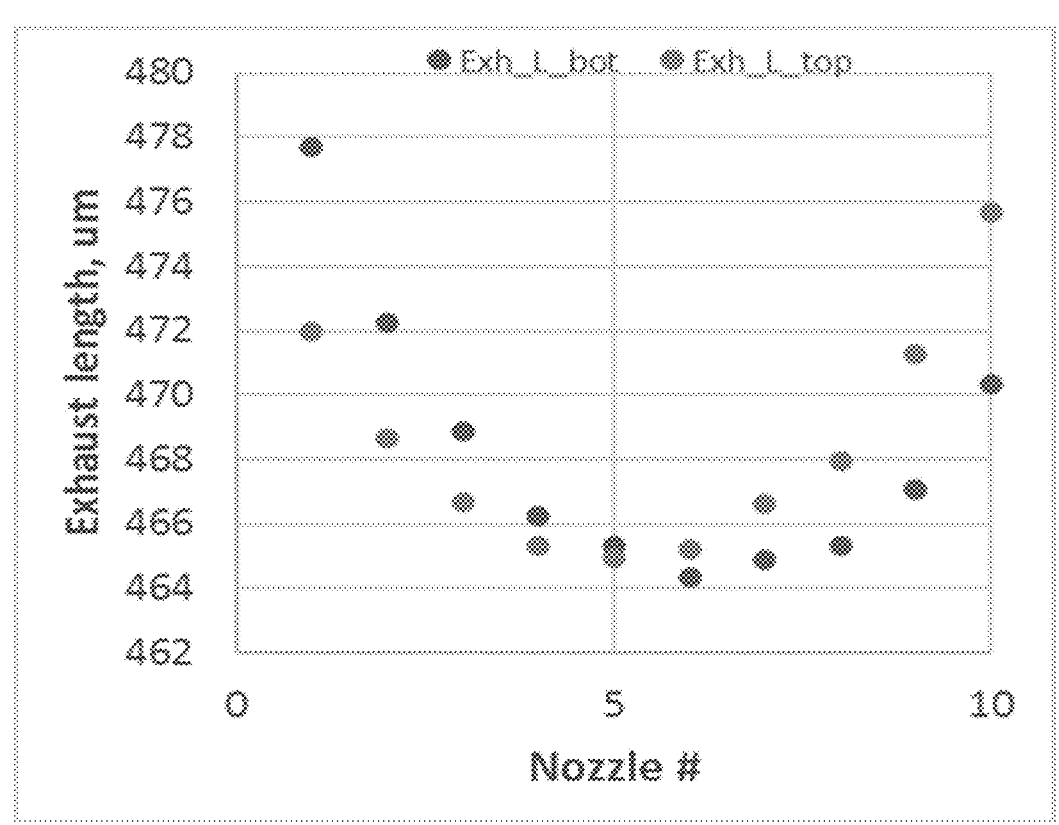
Figure 6C:
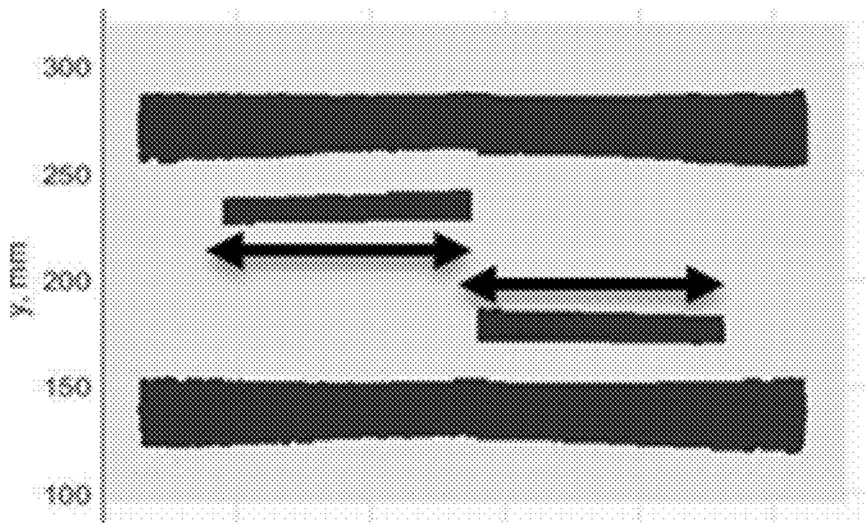
Figure 6D:
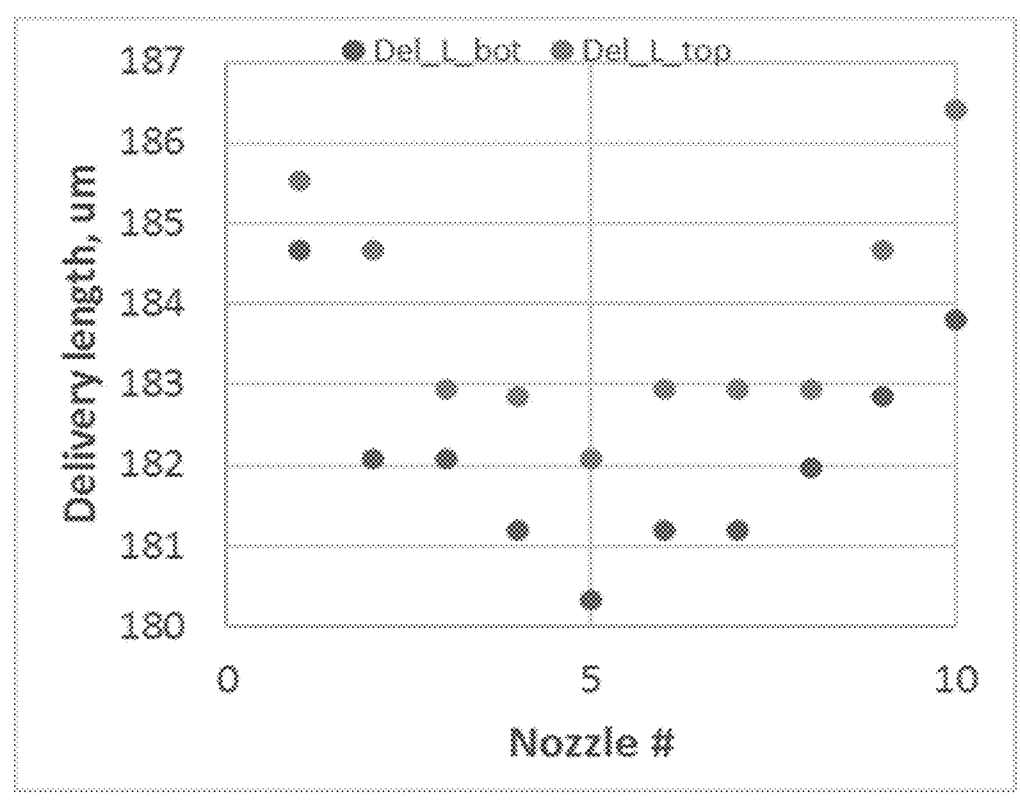

FIGS. 6A-6D show the aperture dimensions and measurements from typical print dies. The parameters include the length and width of the exhaust and delivery channels. The width of the channels is controlled by the photolithography process used by the MEMS manufacturer. Photolithography is typically a well-controlled process with accuracy and repeatability of printed features to 0.1 microns or better. Etched channel length is determined by the deep reactive ion etch (DRIE) process. This process is not as well controlled as the photolithography process and is the major source of aperture size variation both within a die and within a wafer. FIG. 6A shows a depositor on the edge of the die. The arrows in the figure show the length of the exhaust channels and FIG. 6B shows the length of the top and bottom channels for each depositor in a die with 10 depositors. Total span of the 10 aperture (nozzle in the plots) assemblies from aperture 1 to aperture 10 is 9.5 mm. Exhaust aperture length is the sum of the exhaust channel etch depth in each of the two wafers. The etch depth and resulting aperture length are not consistent across the die and show a parabolic profile. FIG. 6C shows the delivery aperture lengths in the depositor. FIG. 6D shows the channel depths for the top and bottom delivery aperture. The delivery channels show a larger percentage difference between top and bottom than exhaust partly because each delivery aperture is etched on a separate wafer, while the multiple etches required to make the exhaust apertures have an averaging effect. The deposition apertures show the same parabolic length profile as the exhaust apertures.

The difference in etch rate between the center of the die and edge of the die is partially due to local etch loading effects. Etch loading refers to the amount of silicon removed from a given area. If the etched features in a region are sparser, such as along the edges of a large etch pattern, the etch will proceed to a target depth more rapidly than in a region with greater etch loading, such as at the center of the pattern. Local variations in etch load may be addressed by surrounding active depositors with non-functional "dummy" depositors with a similar etch load at edges of a depositor array. This strategy does not, however, address non-uniformities inherent in the DRIE tools and the DRIE process itself. Etching typically proceeds more slowly at the center of a wafer than near its perimeter due to etch kinetics. Cross-wafer variation limits the precision to which an etch depth tolerance may be held across a large die without an etch stop.

Figure 7A:
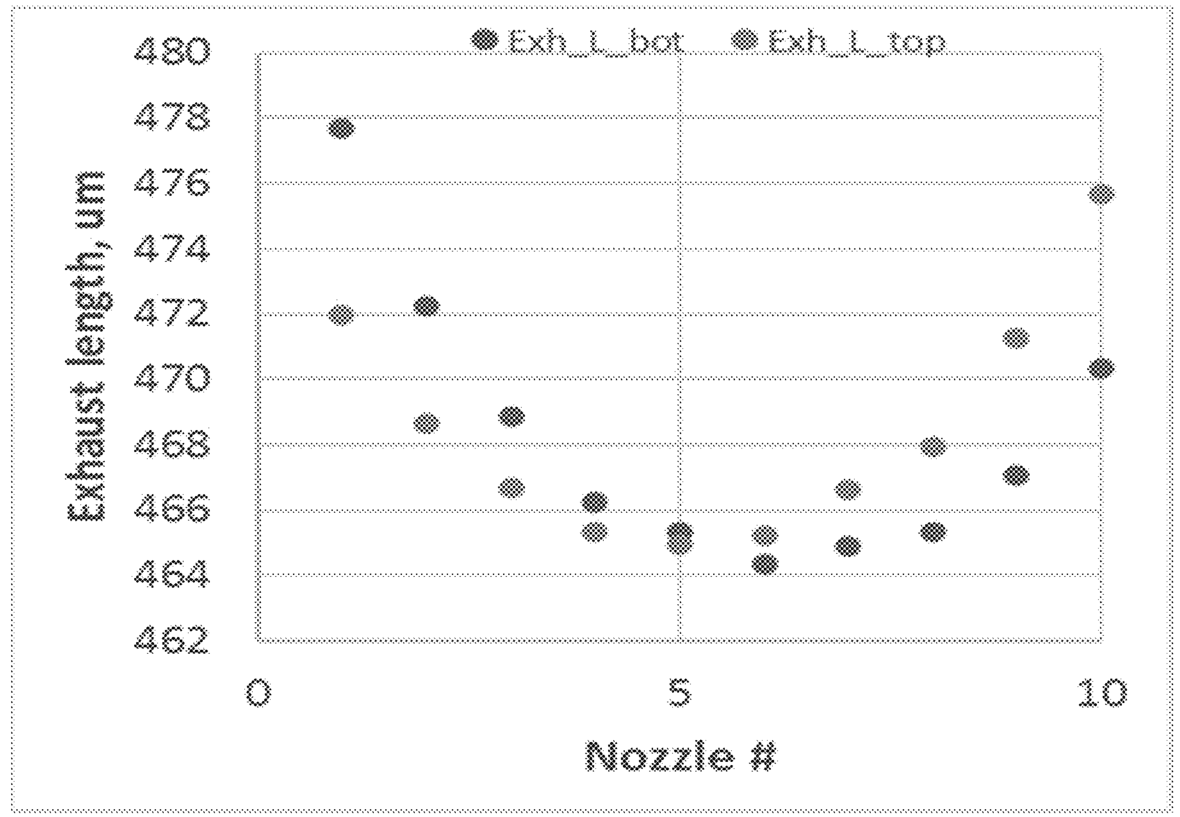
FIGS. 7A-7B show a comparison of the aperture dimensions from a research scale, 10 depositor die, and a production scale 240 depositor die according to embodiments of the disclosed subject matter.
Figure 7B:
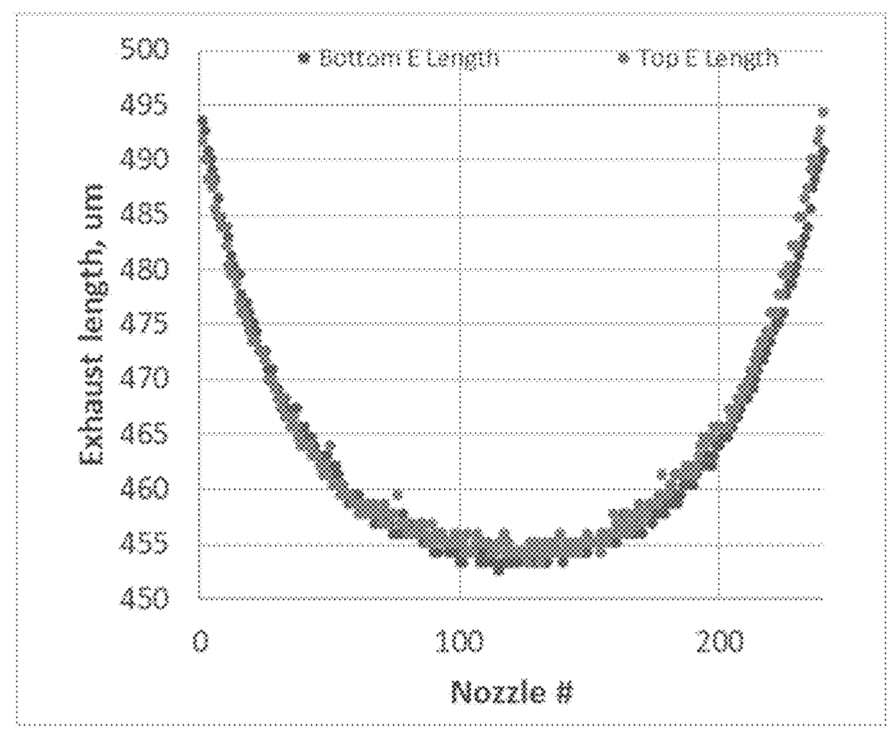
Figure 7C:
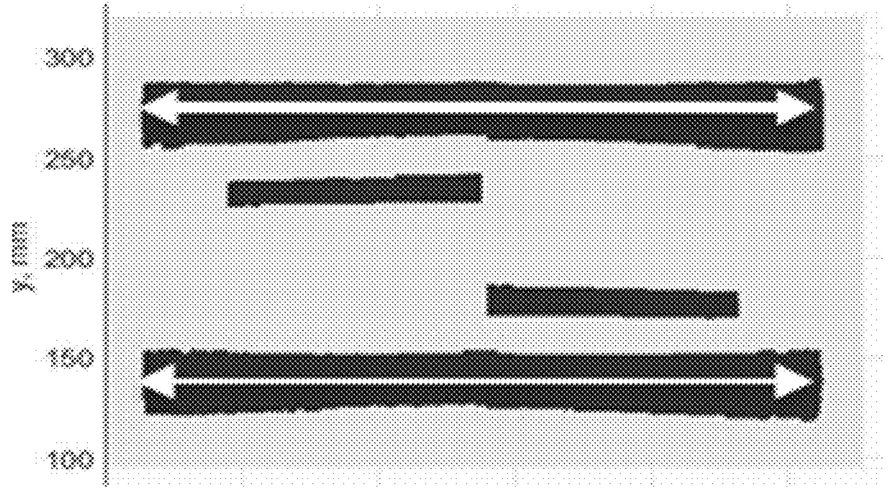
FIG. 7C shows the location on the die where exhaust length measurements are taken according to an embodiment of the disclose subject matter.

Production dies are much larger than the ten (10) depositor development die that was used to develop OVJP technology, and production dies contain many more depositors. For example, a 100 mm long OVJP die may be manufactured with 240 depositors, and the length of the exhaust apertures were measured. FIGS. 7A-7B show a comparison of exhaust aperture lengths in the 10 depositor die (as shown in FIG. 7A) to the 240 depositor die (as shown in FIG. 7B). For the 10 depositor die, the variability (range/mean) is 3%, and the variability (range/mean) is 8.9% for the 240 aperture die. This amount of variability among apertures is well beyond the 1% aperture length nonuniformity limit to eliminate visible line mura on a display.

An etch stop layer may be used to improve etch depth uniformity. Most commonly, an etch stop layer is included in a vertically deposited structure such as epitaxial layers used in compound semiconductors. Aluminum arsenide is often used as an etch stop for a gallium arsenide gate etch pseudomorphic InGaAs HEMT fabrication. Incorporation of an etch stop in non-epitaxial structure is more difficult and requires more fabrication steps and additional wafer bonding. High uniformity OVJP print dies are disclosed herein that use DEC to shape the deposition and are fabricated using an etch stop. The process descriptions below include the steps unique to the etch stop technique and omit process steps such as fabricating vias and singulation of the die within each wafer. The accompanying figures show the aperture face of the die and the location of the etch stop layers.

Figures 8A, 8B, 8C:
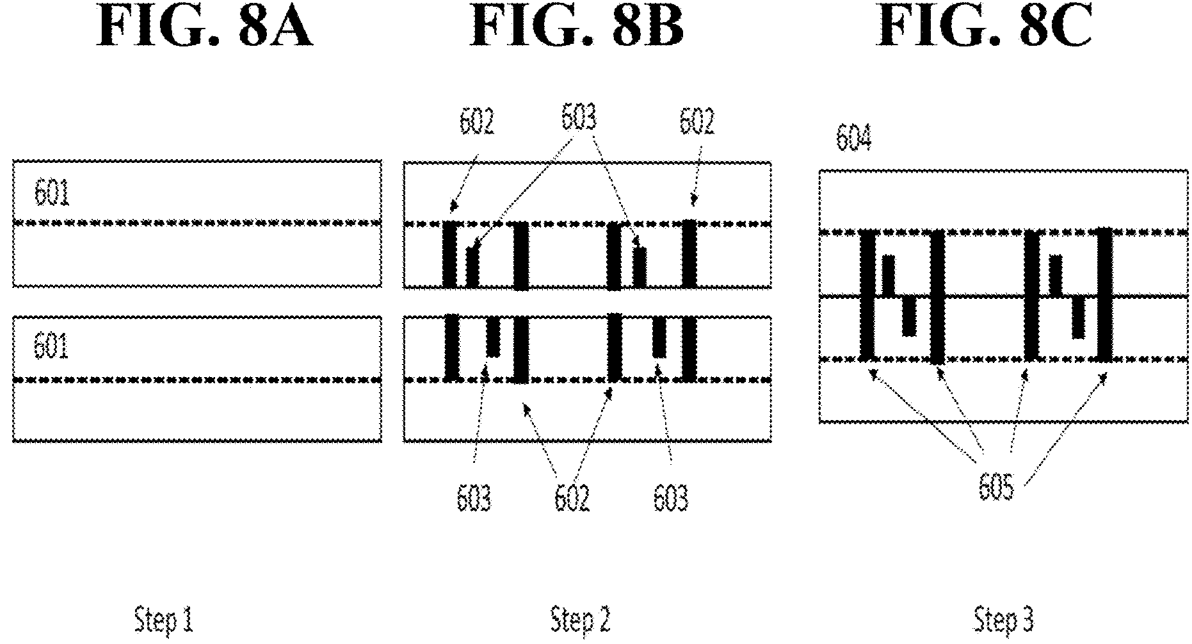
FIGS. 8A-8C show a method to improve aperture length uniformity by using a buried oxide layer as an etch stop for the aperture etch according to embodiments of the disclosed subject matter.

FIGS. 8A-8C shows a process that uses etch stop layers to define the etch depth of the exhaust channel in a print die according to embodiments of the disclosed subject matter. FIG. 8A shows the fabrication of two silicon wafers 601 with a buried $SiO_2$ layers as the etch stop. The wafers are fabricated by oxidizing the surfaces of the wafers, bonding the wafers together, and then grinding and polishing each surface to place the buried oxide layer (BOx layer) indicated by the dashed line shown in FIGS. 8A-8C at a predetermined distance from the wafer surfaces. Each of the two wafers may be processed using DRIE to form delivery channels 603 and exhaust channels 602. The exhaust channels may be formed using a nested etch. A short etch followed by a longer etch may be used to form the exhaust channel. The short first etch depth may be equivalent to the length difference between the exhaust and delivery channels. The second deeper etch may stop at the etch stop 605 for the exhaust channel. The delivery channel may be formed as a timed etch, as in standard processing. The two wafer pairs may be the bonded to form the OVJP print die 604.

Figure 9A:
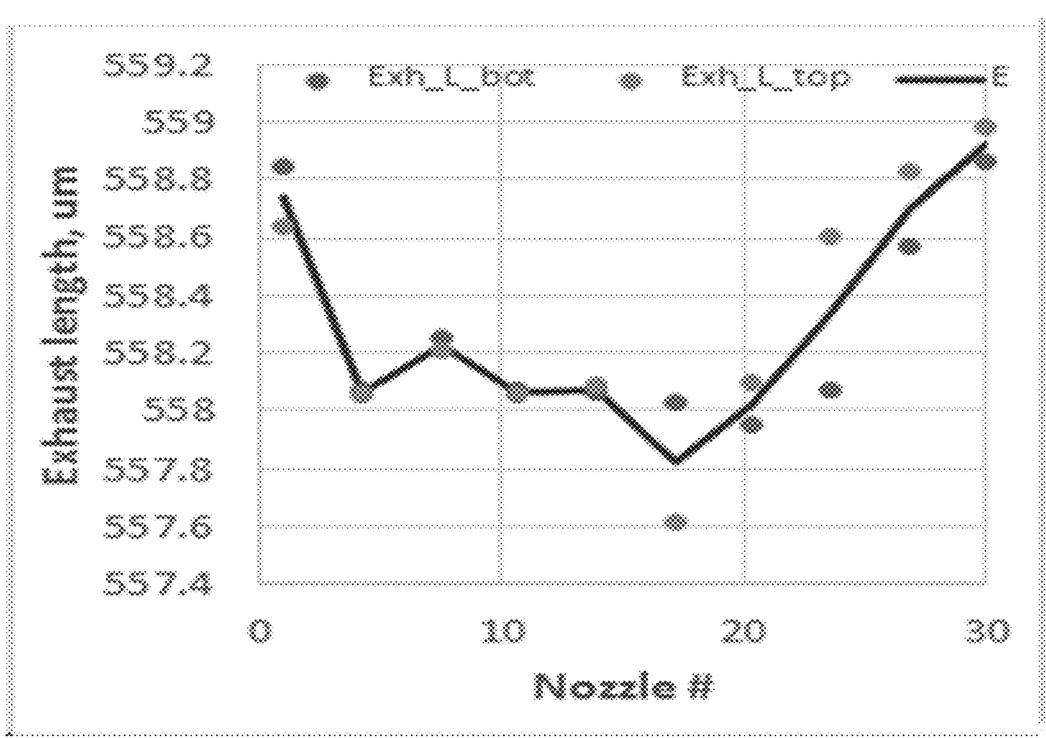
FIGS. 9A-9B show a comparison of aperture length formed by a timed DRIE etch and a DRIE etch using an etch stop according to embodiments of the disclosed subject matter.
Figure 9B:
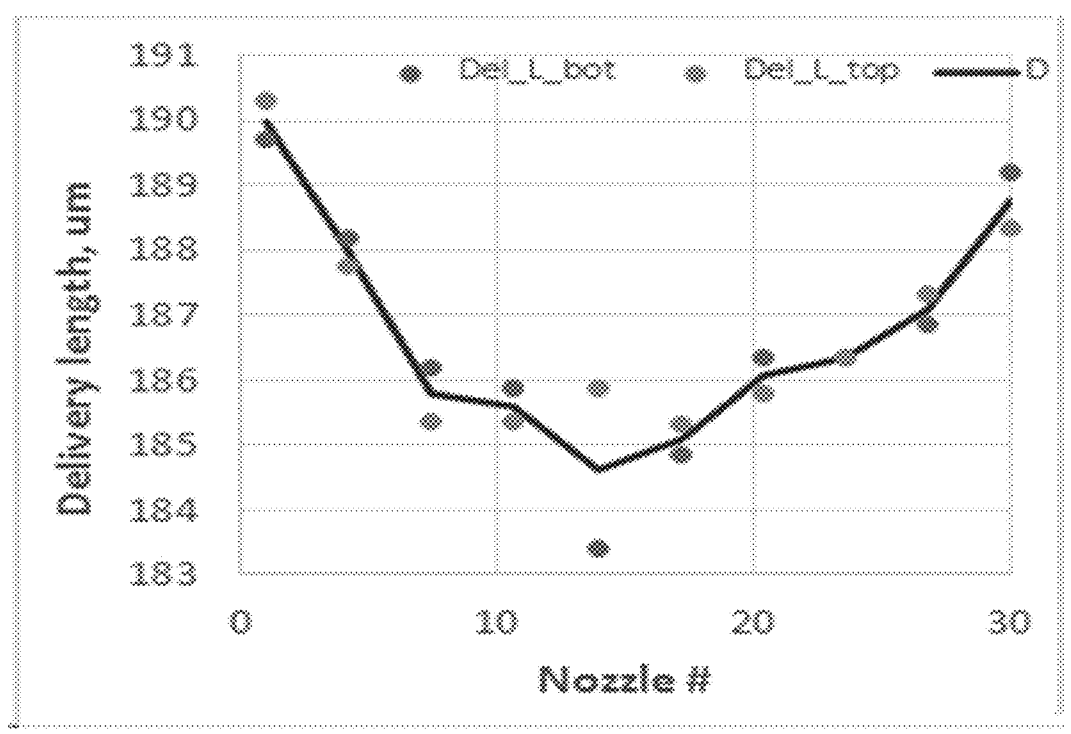

A 30 aperture-set die spanning 9.5 mm along the die edge may be fabricated using the process shown in FIGS. 8A-8C and described above. FIGS. 9A-9B show a comparison of the etch depth variability of the delivery (as shown in FIG. 9A), and exhaust apertures (as shown in FIG. 9B). As was shown in FIGS. 6A-6D, the magnitude of the variability may scale with the etch depth. For the exhaust channel etch, the variation may be 7 μm for a 235 μm etch depth (3%), and the delivery channel may be 4 μm for a 183 μm etch depth (2.2%). Comparing the timed etch delivery channel and etch stop exhaust channel in the wafer processed used in connection with the embodiments shown in FIGS. 8A-8C, the embodiments shown in FIGS. 9A-9B may show different results. For the timed delivery channel etch, the variation may be 5 μm in a 185 μm deep etch (2.7%). For the etch stop exhaust channel, the variation may be 0.4 μm in a 279 μm deep channel (0.1%). The variability in the exhaust etch may be within the range of error for the white light interferometer used to make the measurement and is much less than the 1% deposition nonuniformity requirement for display line mura.

Figures 10A, 10B, 10C:
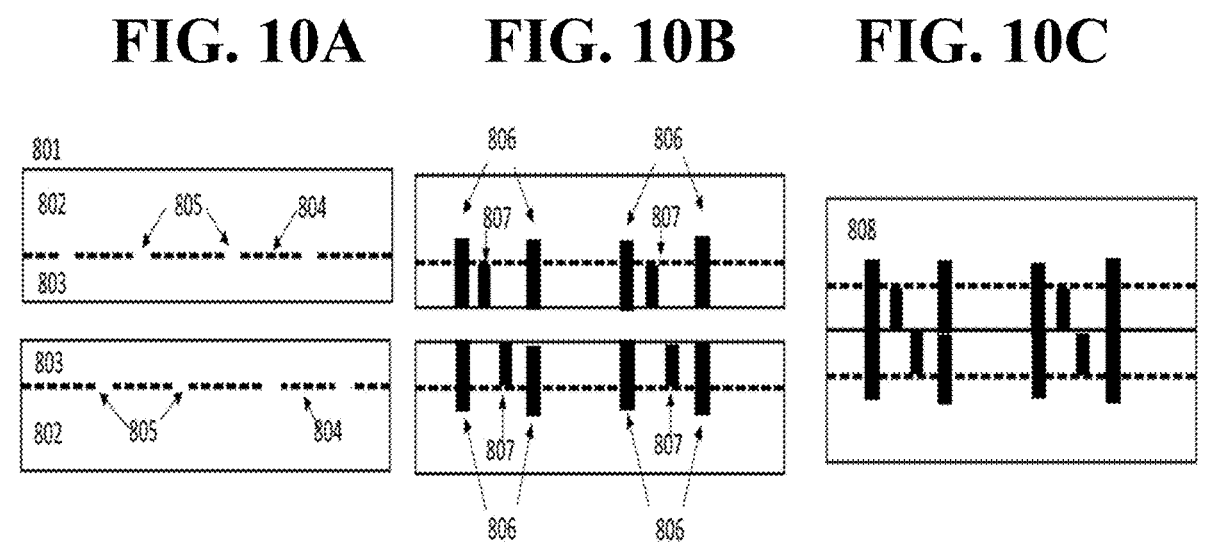

The process of the embodiments shown in FIGS. 8A-8C may demonstrate the degree of etch depth control that can be achieved using an etch stop process. The delivery channel may be more critical to the deposition thickness but may be the shallower etch. FIGS. 10A-10C show a modified process that uses a buried oxide layer as an etch stop for the delivery channel and a timed etch for the exhaust channel. Similar to the embodiments shown in FIGS. 8A-8C, the first step (as shown in FIG. 10A) may be to prepare wafers 801 with BOx layers. In FIGS. 10A-10C, the oxide layer 804 formed on the first Si wafer 802 may be patterned with vias 805 that correspond to the locations of the exhaust channels before bonding to another silicon wafer 803. The bonded wafers may be ground and polished to place the patterned buried oxide layer at the desired distance from the surfaces of the bonded wafer pair. Wafers with the patterned BOX layer may be processed using the standard nested etch process. Wafers may be patterned with a two-layer masking pattern of plasma oxide and a photoresist. The shallow first etch may be performed on the exhaust channels 806 and then the delivery channel mask may be opened and the deep etch is performed on both the exhaust 806 and delivery channels 807. The exhaust etch continues through the vias in the buried oxide mask and the deposition etch stops at the buried oxide layer. While the depth of the delivery channel may be controlled by the etch stop, a nested etch may be used to time the etches and reduce damage to the delivery channel sidewalls. After completion of the etch process, the wafers may be bonded to form the delivery and exhaust channels and apertures and a complete OVJP print die 808.

Figure 11:
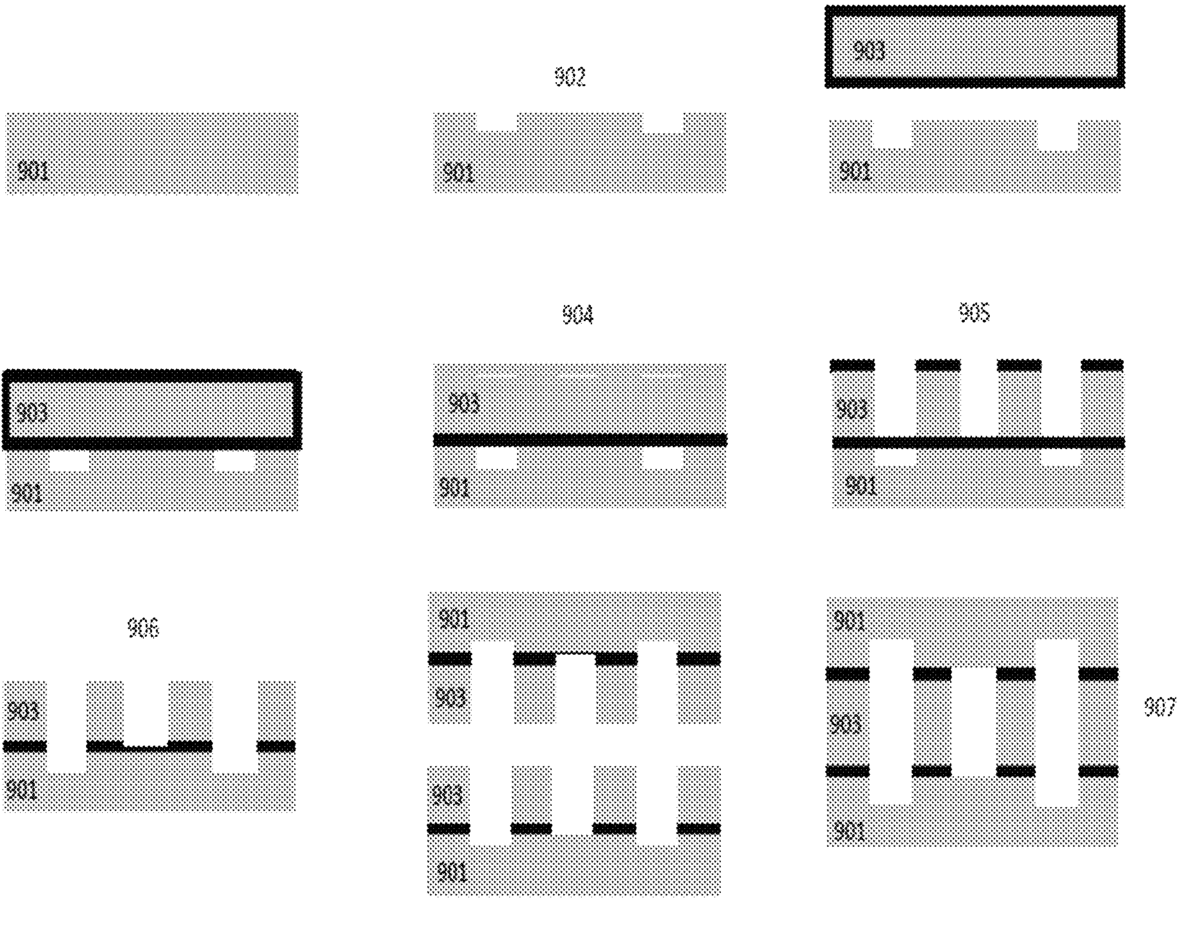
FIG. 11 shows an alternate method of manufacturing a high uniformity print die using an un-patterned etch stop according to an embodiment of the disclosed subject matter.

The embodiments of the disclosed subject matter shown in FIG. 11 is similar to the embodiments shown in FIGS. 10A-10C and described above but does not require patterning and etching of the BOX layer. A DRIE step may be used to remove silicon from the inner surface of each handle wafer before they are bonded into SOI (silicon-on-insulator) wafers. A silicon wafer 901 may be patterned with the exhaust channel masks, and the wafer may be etched with a shallow etch that corresponds to the difference between the deposition and exhaust channel lengths 902. A separate silicon wafer may be oxidized 903 and may be bonded to the previously patterned wafer 902. This wafer pair may be ground and polished to place the BOX layer at the desired distance from each wafer surface. The surface of the bonded wafer 903 may be patterned and etched using a single etch step, or a thick photoresist film may be used. Both delivery channel and exhaust channels may stop at the etch stop 905. The oxide may be removed, which opens the exhaust channels to the shallow channels etched into the first wafer 901. Wafers 906 may be bonded to form the OVJP MEMS die 907.

Figures 12A, 12B, 12C:
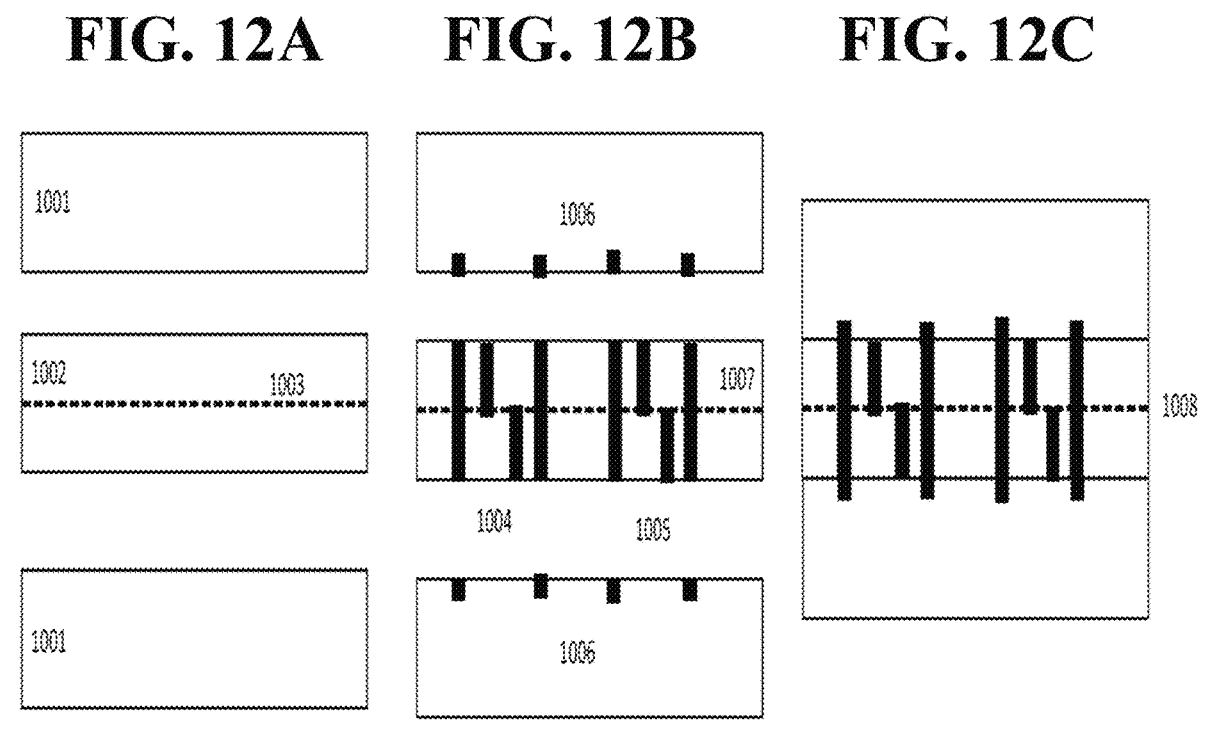

In the embodiments shown in FIGS. 12A-12C, a buried oxide wafer 1002 is made by oxidizing a silicon wafer and bonding it to another silicon wafer. The position of the BOx layer 1003 may be adjusted by grinding and polishing the surfaces of the wafer. This buried oxide wafer may be processed from each side forming delivery 1004 and exhaust channels that terminate on the BOx layer 1007. Two additional wafers 1001 may be processed with shallow etched channels 1006 that match the exhaust channels in 1007. These wafers may be thinner than the center wafer to minimize completed die thickness. The two additional wafers may be bonded to the center wafer forming the completed OVJP MEMS print die 1008.

Figures 13A, 13B, 13C:
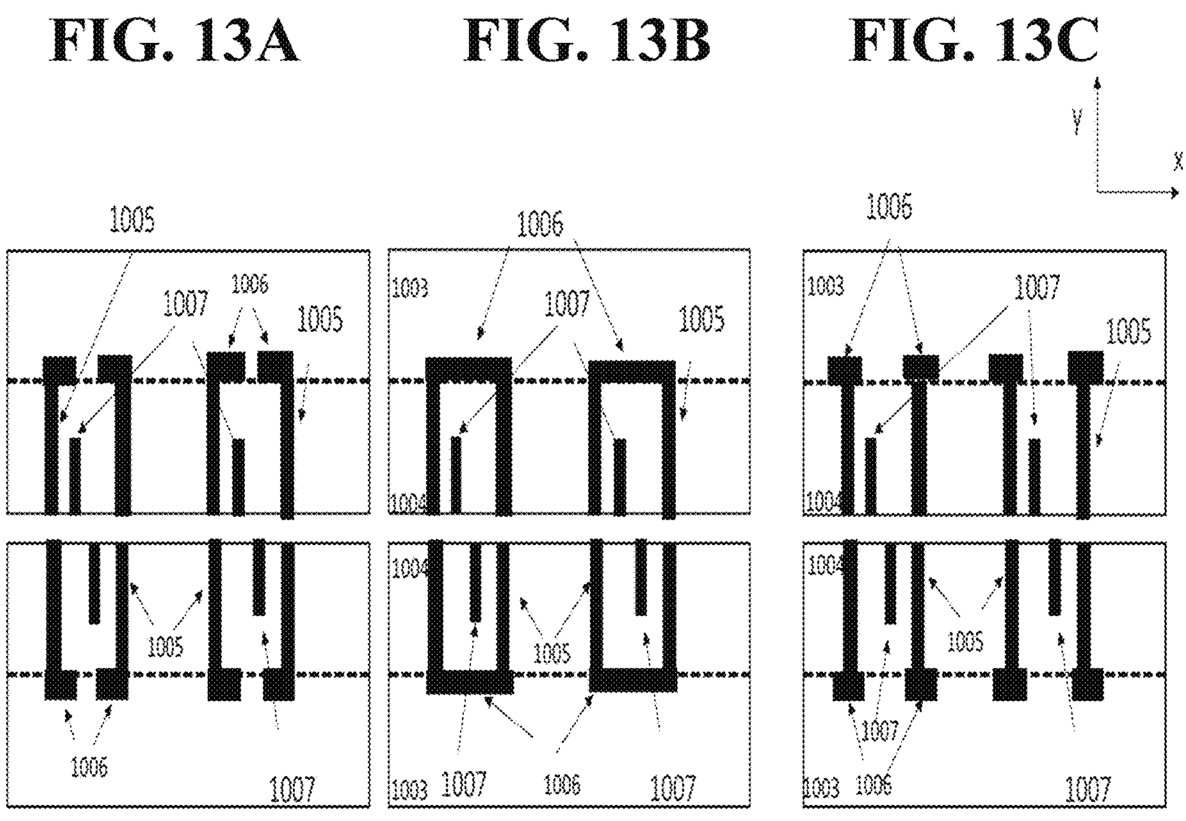
FIGS. 13A-13C show an alternate configuration of exhaust apertures that are possible using the 2 wafer etch stop process with butterfly depositors according to embodiments of the disclosed subject matter.

FIGS. 13A-13B show different die type structures that can be achieved using 2-layer stack (e.g., one etch stop $SiO_2$ layer) designs. FIGS. 13A-13B show two un-bonded BOx wafer pairs. The presence of the buried oxide, indicated by the dashed line in FIGS. 13A-13B, may allow for the implementation of additional horizontally etched elements (x-axis oriented) in the design. The process flow described above in connection with FIGS. 8A-8C allows generation of vertical channels 602, where etched channels may be aligned along the y-axis, as shown in FIG. 8B. To improve on this design, the x-axis-oriented exhaust extensions 1006 may be DRIE etched in a plain wafer 1003 before bonding, and FIGS. 13A-13C show where the lengths of the 1006 channels are varied. Y-axis oriented channels 1005 may be etched in BOX oxide wafer 1004 as previously described above. Channel 1005 depth may be defined by the etch stop layers. X-axis oriented channel extensions 1006 may be aligned closer to the delivery channels, 1007, as shown in FIG. 13A. In another embodiment, channels 1006 may fill the gap between to y-axis-oriented exhaust channels 1005, as shown in FIG. 13B. In this case, exhaust channel may form a rectangular pattern around the delivery channels 1007 for better chemistry confinement and over-spray suppression. In another example, channels 1006 may be arranged in a 'T' pattern, as shown in FIG. 13C.

Figures 14A, 14B, 14C:
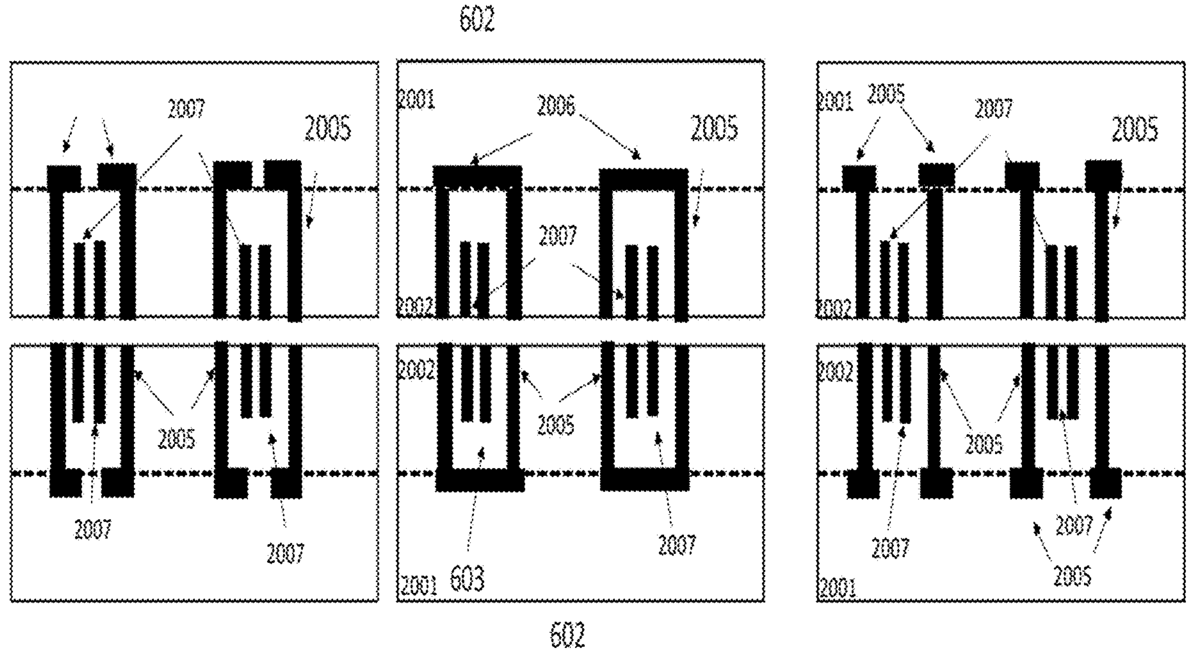
FIGS. 14A-14C show an alternate configuration of exhaust apertures using the 2 wafer etch stop process with bifurcated depositors according to embodiments of the disclosed subject matter.

Embodiments shown in FIGS. 14A-14C may include a bifurcated design. In addition to single delivery slot 1007 shown in FIGS. 13A-13C, a delivery nozzle may be included by forming a bifurcated design 2007 that include two deliveries as shown in FIG. 14A-14C.

Figures 15A, 15B, 15C:
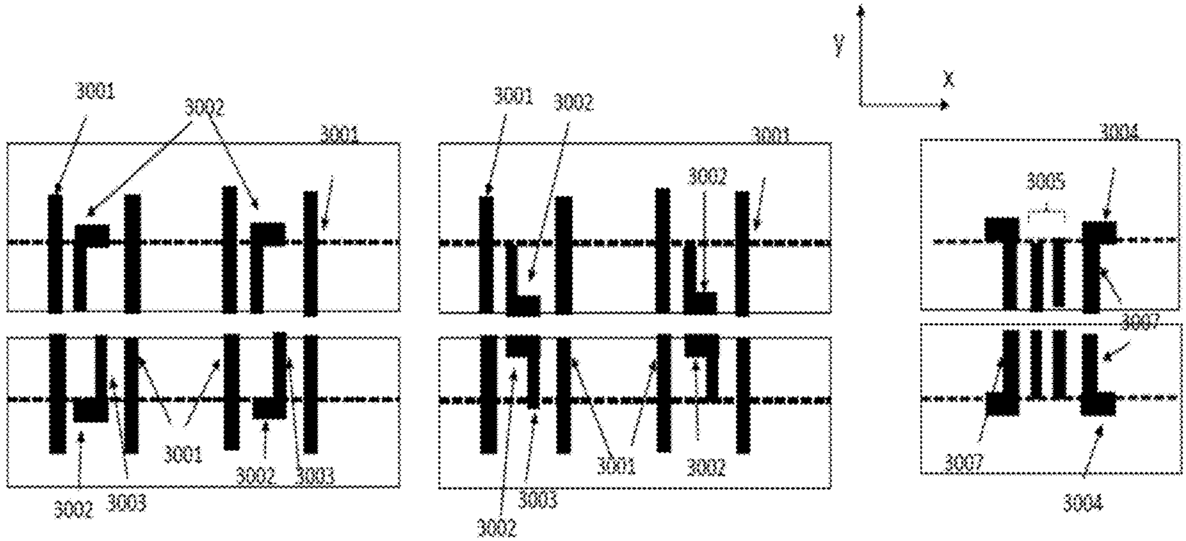
FIGS. 15A-15C show alternate delivery and exhaust aperture configurations with 2 wafer etch stop process according to embodiments of the disclosed subject matter.

FIGS. 15A-15C show embodiments of the disclosed subject matter that may be a modification to those shown and described in FIGS. 10A-10B for the controlled delivery length idea. FIGS. 15A-15B show a delivery channel composed of one channel that is parallel to the y-axis 3003 and one delivery channel extension that is parallel to the x-axis 3002. This arrangement allows for the effective pixel-fill of the material gap formed between two delivery depositors during OVJP. In another embodiment, both y-axis-oriented exhaust 3007 and delivery 3005 lengths may be fixed by the BOX structure of the $SiO_2$, as shown in FIG. 15C. The x-axis oriented exhaust extensions 3004 may be added to the top and bottom of the exhaust channels 3007. Both splitdepositors 3003 and bifurcated depositors 3005 may be enclosed, but are not limited by those shown herewith.

That is, the figures described above show various embodiments of the disclosed subject matter. An apparatus may be provided that include an organic vapor jet print die including a linear array of depositors, with each of the depositors having a cluster of apertures. The organic vapor jet print die may include at least one first aperture in each cluster of apertures is a delivery aperture that is in fluid communication with a carrier gas source and an evaporation oven. At least one second aperture in each cluster of apertures may be an exhaust aperture in fluid communication with a vacuum reservoir with a static pressure lower than that at the apertures. The delivery apertures and exhaust apertures may have a length nonuniformity that is less than 0.4%, less than 0.3%, less than 0.2%, and/or less than 0.1%. The delivery apertures and exhaust apertures are formed from bonded silicon wafers and a bisection of channels etched into the face of a silicon wafer including a buried oxide layer. The channels that form the delivery apertures and/or exhaust apertures may be configured to extend completely through one of a silicon layer of a wafer with a buried oxide layer, and/or not extend into the silicon layer on the other side of the buried oxide layer of that wafer. The exhaust apertures may be longer than the delivery apertures.

The buried oxide layers of the bonded silicon wafers may be patterned.

The etched delivery aperture may stop at a surface of the buried oxide layer. The buried oxide layer may be configured to form one side of a delivery aperture and/or an exhaust aperture. A buried oxide layer may be disposed within a middle wafer of a three-wafer stack. A buried oxide layers may be disposed within each wafer of a two-wafer stack. The buried oxide layers may be patterned. Etched cavities positioned adjacent to the buried oxide layer may be disposed on sides of each wafer that are bonded together of the two-wafer stack.

The bonded silicon wafers may include a first silicon wafer a second silicon wafer, and a third silicon wafer.

For example, as shown in FIGS. 13A-13B, the delivery channels may be coupled to the delivery apertures, and exhaust channels that are coupled to the exhaust apertures, where the delivery channels and the exhaust channels terminate at the buried oxidized layer of the first silicon wafer. The second silicon wafer and the third silicon wafer may have channels that match the exhaust channels of the first silicon wafer.

FIG. 13C shows another example embodiment, where delivery channels may be coupled to the delivery apertures, and delivery channel extensions that are parallel to a first axis (e.g., the x-axis) and are coupled to the delivery channels, where the delivery channels are disposed a direction that is parallel to a second axis (e.g., the y-axis).

The apparatus may include exhaust channels that are coupled to the exhaust apertures. Exhaust extensions for the exhaust channels may be parallel to a first axis (e.g., the x-axis), where the exhaust channels are parallel to a second axis (e.g., the y-axis).

The apparatus may include delivery channels having a first portion and a second portion that are coupled to the delivery apertures, where the first portion and the second portion bifurcate the delivery channels.

The apparatus may include delivery channels coupled to the delivery apertures, and exhaust channels coupled to the exhaust apertures. A length of the exhaust channel may be defined by an etch stop of the buried oxide layer, and a length delivery channels are based on a timed etch.

The apparatus may include a first surface of a first silicon wafer of a first wafer pair of the bonded silicon wafers, where the first surface has open exhaust channels coupled to the exhaust apertures in the first wafer pair. A second wafer may be bonded to the first wafer pair to form a print die with the bonded silicon wafers, where the second wafer pair is the same the first wafer pair.

An embodiment shown in FIG. 8 may include forming a first buried oxide layer on a first silicon wafer and a second buried oxide layer on a second silicon wafer, where the first buried oxide layer and the second buried oxide layer form etch stops. Delivery channels and exhaust channels may be formed for a print die on the first silicon wafer and the second silicon wafer, where a depth of the delivery channels and/or the exhaust channels is based on the etch stops. The first silicon wafer may be bonded to a second silicon wafer to form a wafer pair for the print die.

Delivery channels may be formed having a first depth, and the exhaust channels having a second depth, where the second depth is greater than the first depth. Exhaust channels that stop at the etch stop may be formed, and the length of the delivery channels may be based on a timed etch.

The first silicon wafer and the second silicon wafer may be ground and polished to place the etch stops of the buried oxide layer at predetermined locations.

An embodiment shown in FIG. 10 may include forming a first patterned buried oxide layer on a first silicon wafer and a second patterned buried oxide layer on a second silicon wafer, where the first buried oxide layer and the second buried oxide layer form patterned etch stops, and where the first patterned buried oxide layer includes first vias and the second patterned buried oxide layer includes second vias. Delivery channels and exhaust channels for a print die may be formed on the first silicon wafer and the second silicon wafer based on the patterned etch stops, where the exhaust channels are formed at the first vias and the second vias in the first silicon wafer and the second silicon wafer. The first silicon wafer may be bonded to a second silicon wafer to form a wafer pair for the print die.

A first length of the exhaust channels may increase after bonding the first silicon wafer to the second silicon wafer. A timed etch may form the exhaust channels through the first vias and the second vias in the first silicon wafer and the second silicon wafer.

The forming the delivery channels may include stopping the etching of each of the delivery channels based on the patterned etch stops. The first silicon wafer and the second silicon wafer may be ground and polished to place the patterned etch stops of the buried oxide layer at predetermined locations.

Delivery channel extensions may be formed that are parallel to a first axis, where the delivery channels for the first silicon wafer and the second silicon wafer are etched in a direction that is parallel to a second axis. Exhaust extensions for the exhaust channels may be formed that are parallel to a first axis, where the exhaust channels are parallel to a second axis. The delivery channels may include a first portion and a second portion, so that the delivery channels are bifurcated.

An embodiment shown in FIG. 11 may include a first silicon wafer that is patterned with the exhaust channel masks, and the first silicon wafer may be etched to correspond to a difference between deposition channel and exhaust channel lengths. An oxidation layer may be formed on a second silicon wafer. The first silicon wafer may be bonded to the second silicon wafer to form a first wafer pair. The first wafer pair may be ground and polished to place an etch stop of the oxidation layer at a predetermined location. A first surface of the first silicon wafer of the first wafer pair may be patterned, and the first surface may be etched, where the etching of delivery channels and exhaust channels stop at the etch stop. The oxide layer may be removed to open the exhaust channels in the first wafer pair. A second wafer pair may be bonded to the first wafer pair to form a print die, where the second wafer pair is the same the first wafer pair.

The second wafer pair may be formed by patterning a third silicon wafer with the exhaust channel masks, and etching the third silicon wafer to correspond to a difference between deposition channel and exhaust channel lengths. An oxidation layer may be formed on a fourth silicon wafer. The third silicon wafer may be bonded to the fourth silicon wafer to form the second wafer pair. The method may include grinding and polishing the second wafer pair to place an etch stop of the oxidation layer at a predetermined location. A first surface of the third silicon wafer of the second wafer pair may be patterned, and the first surface etched, where the etching of delivery channels and exhaust channels stop at the etch stop. The oxide layer may be removed to open the exhaust channels in the second wafer pair.

An embodiment shown in FIG. 12 may include forming a buried oxidized layer on a first silicon wafer. The position of the buried oxide layer may be adjusted by grinding and polishing one or more surfaces of the first silicon wafer. First delivery channels and first exhaust channels may be etched in a first surface of the first silicon wafer that stop on the buried oxidized layer. Shallow exhaust channels may be etched in a second silicon wafer that match the first exhaust channels in the first silicon wafer. A first surface of the first silicon wafer may be bonded to the second silicon wafer. Second delivery channels and second exhaust channels may be etched in a second surface of the first silicon wafer. Delivery channels and exhaust channels that terminate at the buried oxidized layer may be formed. A third silicon wafer may be etched with channels that match the first exhaust channels of the first silicon wafer. The first silicon wafer and the third silicon wafer may be bonded to form a print die.

The second silicon wafer may be bonded to a first side of the first silicon wafer, and the third silicon wafer may be bonded to a second side of the first silicon wafer. The second silicon wafer and the third silicon wafer may be thinner than the first silicon wafer. The first silicon wafer may be ground and polished to place patterned etch stops of the buried oxide layer at predetermined locations.

That is, as shown in FIG. 12, Shows a method of forming a print die, including etching a portion of exhaust channels in a first wafer and second wafer. Exhaust and deposition channels may be etched in a third wafer that includes an etch stop layer positioned between a first surface and a second surface of the third wafer. The etched surface of the third wafer may be bonded to the first wafer so that the exhaust channels align. A second set of deposition and exhaust channels may be etched in the second surface of the third wafer, and the second surface may be bonded to the etched surface of the second wafer to form a print die.

An embodiment shown in FIG. 13 may be a print die that is formed by etching first exhaust channel extensions in a first axis in a first wafer pair including a first buried oxidized layer as a first etch stop, where the lengths of the first exhaust channel extensions are varied, where the first wafer pair includes a first silicon wafer and a second silicon wafer. First exhaust channels and first delivery channels may be etched along a second axis of the first wafer pair, where a depth of the channels is defined by the first etch stop. Second exhaust channel extensions may be etched in the first axis in a second wafer pair including a buried oxidized layer as a second etch stop, where the lengths of the second exhaust channel extensions are varied, and where the second wafer pair includes a third silicon wafer and a fourth silicon wafer. Second exhaust channels and second delivery channels may be etched along the second axis of the second wafer pair, where a depth of the channels is defined by the second etch stop. The first wafer pair may be bonded to the second wafer pair to form a print die.

The first exhaust channel extensions may be aligned at a first predetermined distance from the first delivery channels, and aligning the second exhaust channel extensions at a second predetermined distance the second delivery channels. The first exhaust channel extensions may form a first rectangular pattern around the first delivery channels. The second exhaust channel extensions may form a second rectangular pattern around the second delivery channels. The first exhaust channel extensions may be arranged in a first t-shaped pattern, and the second exhaust channel extensions may be arranged in a second t-shaped pattern.

The first delivery channels and the second delivery channels may be formed by etching a first portion and a second portion of the first delivery channels and etching a third portion and a fourth portion of the second delivery channels as shown in FIG. 14. The first delivery channels and the second delivery channels may be bifurcated. The first wafer pair and the second wafer pair may be ground and polished to place the first etch stop and the second etch stop of the buried oxide layers at predetermined locations.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An apparatus comprising:

an organic vapor jet print die including a linear array of depositors, with each of the depositors having a cluster of apertures, the organic vapor jet print die comprising:

at least one first aperture in each cluster of apertures is a delivery aperture that is in fluid communication with a carrier gas source and an evaporation oven; and at least one second aperture in each cluster of apertures is an exhaust aperture in fluid communication with a vacuum reservoir with a static pressure lower than that at the apertures, wherein the delivery aperture and the exhaust aperture have a length nonuniformity that is less than 0.4%, wherein the delivery aperture and the exhaust aperture are formed from bonded silicon wafers and a bisection of channels etched into the face of a silicon wafer including a buried oxide layer, and wherein the channels that form at least one from the group consisting of: the delivery aperture and the exhaust aperture extend completely through one of a silicon layer of a wafer with a buried oxide layer and do not extend into the silicon layer on the other side of the buried oxide layer of that wafer.

2. The apparatus of claim 1, wherein the etched delivery aperture stops at a surface of the buried oxide layer.

3. The apparatus of claim 1, wherein the buried oxide layer is configured to form one side of at least one from the group consisting of: the delivery aperture, and the exhaust aperture.

4. The apparatus of claim 1, wherein the buried oxide layer is disposed within a middle wafer of a three-wafer stack.

5. The apparatus of claim 1, wherein the buried oxide layer is disposed within each wafer of a two-wafer stack.

6. The apparatus of claim 5, wherein the buried oxide layer is patterned.

7. The apparatus of claim 5, wherein etched cavities positioned adjacent to the buried oxide layer are disposed on sides of each wafer that are bonded together of the two-wafer stack.

8. The apparatus of claim 1, wherein the bonded silicon wafers include a first silicon wafer a second silicon wafer, and a third silicon wafer, the apparatus further comprising:

delivery channels that are coupled to the delivery apertures, and exhaust channels that are coupled to the exhaust apertures, wherein the delivery channels and the exhaust channels terminate at the buried oxidized layer of the first silicon wafer, wherein the second silicon wafer and the third silicon wafer have channels that match the exhaust channels of the first silicon wafer.

9. The apparatus of claim 1, wherein the buried oxide layers of the bonded silicon wafers are patterned.

10. The apparatus of claim 1, wherein the exhaust aperture is longer than the delivery aperture.

11. The apparatus of claim 1, further comprising:

delivery channels that are coupled to the delivery apertures;

delivery channel extensions that are parallel to a first axis and are coupled to the delivery channels, wherein the delivery channels are disposed a direction that is parallel to a second axis.

12. The apparatus of claim 1, further comprising:

exhaust channels that are coupled to the exhaust apertures;

exhaust extensions for the exhaust channels that are parallel to a first axis, wherein the exhaust channels are parallel to a second axis.

13. The apparatus of claim 1, further comprising:

delivery channels having a first portion and a second portion that are coupled to the delivery apertures, wherein the first portion and the second portion bifurcate the delivery channels.

14. The apparatus of claim 1, further comprising:

a delivery channel coupled to the delivery aperture;

an exhaust channel coupled to the exhaust aperture, wherein a length of the exhaust channel is defined by an etch stop of the buried oxide layer, and a length of the delivery channel is based on a timed etch.

15. The apparatus of claim 1, further comprising:

a first surface of a first silicon wafer of a first wafer pair of the bonded silicon wafers, wherein the first surface has an open exhaust channel coupled to the exhaust aperture in the first wafer pair; and a second wafer is bonded to the first wafer pair to form a print die with the bonded silicon wafers, wherein the second wafer pair is the same the first wafer pair.

* * * * *